(12) United States Patent
Balasubramanian et al.

(10) Patent No.: US 11,145,378 B2
(45) Date of Patent: Oct. 12, 2021

(54) METHODS AND APPARATUS TO IMPROVE PERFORMANCE WHILE READING A ONE-TIME PROGRAMMABLE MEMORY

(71) Applicant: Texas Instruments Incorporated, Dallas, TX (US)

(72) Inventors: Suresh Balasubramanian, Dallas, TX (US); Stephen Wayne Spriggs, Murphy, TX (US); George B Jamison, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/729,146

(22) Filed: Dec. 27, 2019

(65) Prior Publication Data

US 2020/0265907 A1  Aug. 20, 2020

Related U.S. Application Data

(60) Provisional application No. 62/807,547, filed on Feb. 19, 2019.

(51) Int. Cl.
| | |
|---|---|
| *G11C 17/00* | (2006.01) |
| *G11C 17/18* | (2006.01) |
| *H03K 3/356* | (2006.01) |
| *G11C 17/16* | (2006.01) |

(52) U.S. Cl.
CPC .............. *G11C 17/18* (2013.01); *G11C 17/16* (2013.01); *H03K 3/356113* (2013.01)

(58) Field of Classification Search
CPC .. G11C 17/18; G11C 17/16; H03K 3/356113; H03K 3/42

USPC .......................................................... 365/96
See application file for complete search history.

(56) References Cited

U.S. PATENT DOCUMENTS

| 6,351,404 B1 | 2/2002 | Wright | |
| 6,469,482 B1* | 10/2002 | Jahanshir | G11C 5/145 |
| | | | 323/282 |
| 9,859,893 B1* | 1/2018 | Narayanan | H03K 3/35613 |
| 10,853,542 B1* | 12/2020 | Sengupta | G06F 30/327 |

(Continued)

OTHER PUBLICATIONS

Texas Instruments, "8.5.1.7 Non-Volatile Memory" (pp. 75-77) & "8.5.1.8 Error Check and Correct (ECC) OTP" (pp. 77-81), "BQ79606A-Q1 SafeTI™ Precision Monitor With Integrated Hardware Protector for Automotive Battery Pack Applications," Apr. 2019 (269 pages).

(Continued)

*Primary Examiner* — Hoai V Ho
*Assistant Examiner* — Minh Dinh
(74) *Attorney, Agent, or Firm* — Ray A. King; Charles A. Brill; Frank D. Cimino

(57) ABSTRACT

Methods, apparatus, systems and articles of manufacture are disclosed to improve performance while reading a one-time programmable memory. An example apparatus includes: a voltage boost circuit including a first output, a second output, a first input configured to be coupled to a controller, a second input coupled to a first output of a decoder, a third input coupled to a second output of the decoder; and a multiplexer including a first input coupled to the first output of the voltage boost circuit, a second input coupled to the second output of the voltage boost circuit, a third input coupled to an array of memory, and an output coupled to a sensing circuit.

18 Claims, 9 Drawing Sheets

(56) References Cited

U.S. PATENT DOCUMENTS

| | | |
|---|---|---|
| 2005/0169078 A1 | 8/2005 | Balasubramanian |
| 2009/0116288 A1 | 5/2009 | Varkony |
| 2014/0104921 A1* | 4/2014 | Yu .......................... G11C 17/08 365/103 |
| 2014/0285178 A1 | 9/2014 | Williams |
| 2020/0241957 A1* | 7/2020 | Lien .................... G06F 11/1048 |

OTHER PUBLICATIONS

PCT Search Report dated Jun. 4, 2020.

* cited by examiner

US 11,145,378 B2

METHODS AND APPARATUS TO IMPROVE PERFORMANCE WHILE READING A ONE-TIME PROGRAMMABLE MEMORY

RELATED APPLICATION

This patent arises from an application claiming benefit of U.S. Provisional Patent Application Ser. No. 62/807,547, which was filed on Feb. 19, 2019. U.S. Provisional Patent Application Ser. No. 62/807,547 is hereby incorporated herein by reference in its entirety. Priority to U.S. Provisional Patent Application Ser. No. 62/807,547 is hereby claimed.

FIELD OF THE DISCLOSURE

This disclosure relates generally to memory, and, more particularly, to methods and apparatus to improve performance while reading a one-time programmable memory.

BACKGROUND

Memory often includes an array of memory cells each accessible via enabling a corresponding word line and a bit line pair. As such, memory cell often includes a word line switching device and a storage element. In a one-time programmable (OTP) memory, the word line switching device is a metal-oxide semiconductor field-effect-transistor (MOSFET) and the storage element is a floating-gate MOSFET (FGMOS).

Figure 1:
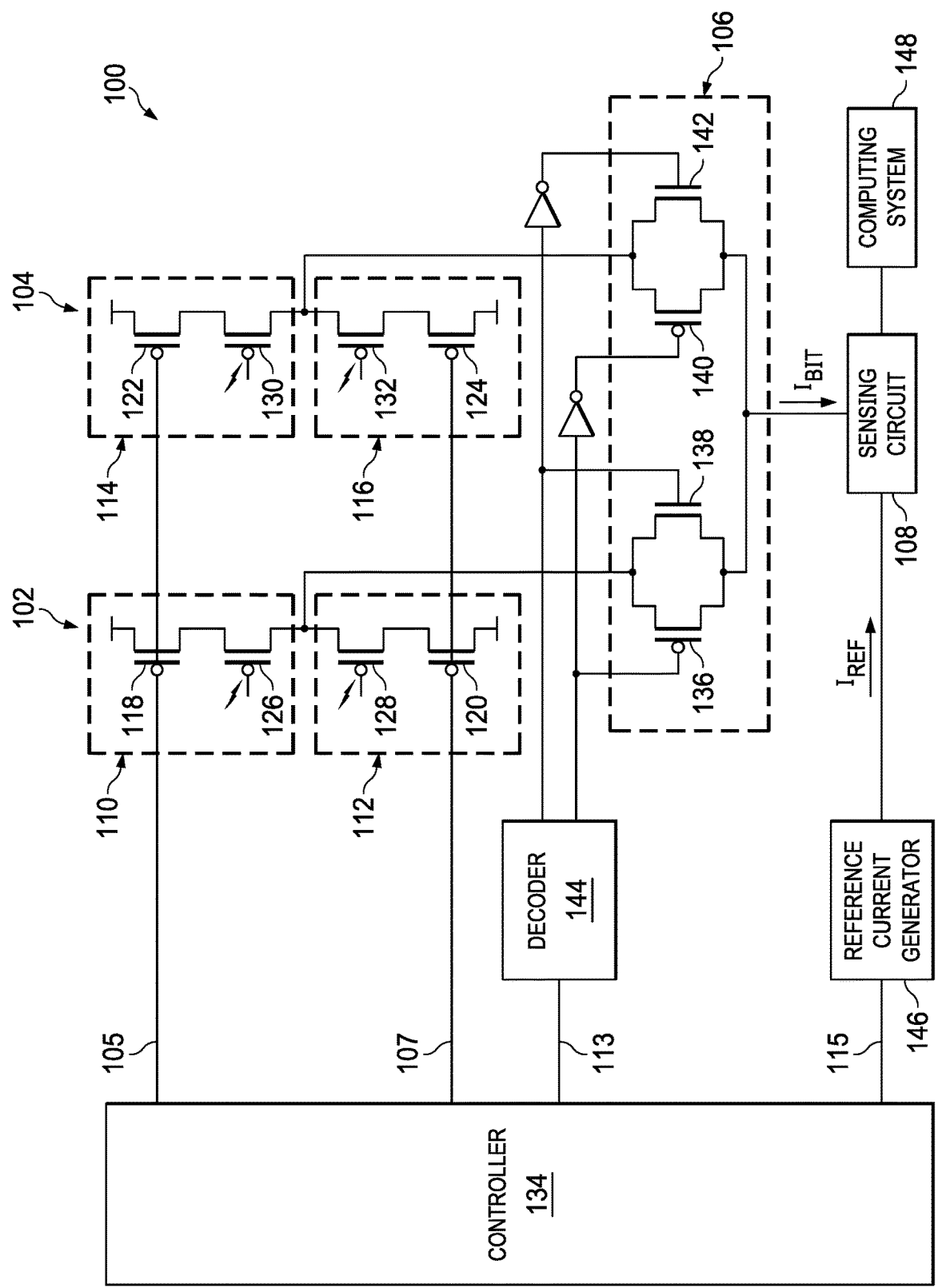
FIG. 1 is a schematic illustration of a first OTP memory array, a second OTP memory array, a multiplexer, and a sensing circuit.

The figures are not to scale. In general, the same reference numbers will be used throughout the drawing(s) and accompanying written description to refer to the same or like parts. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Memory cells are utilized to store binary digital data (e.g., a bit value of 1 or a bit value of 0, a logic high value or a logic low value, etc.) in computing devices and/or any suitable computing architecture (e.g., microcontrollers, etc.). A memory cell may be included in an array of memory cells located in a volatile memory (e.g., random-access memory (RAM), dynamic random-access memory (DRAM), static random-access memory (SRAM), etc.) or in a non-volatile memory (e.g., read-only memory (ROM), mask ROM, programmable read-only memory (PROM), OTP memory (e.g., a one time programmable memory array), erasable programmable read-only memory (EPROM), electrically erasable programmable read-only memory (EEPROM), flash memory, etc.).

As discussed previously, an OTP memory is a type of non-volatile memory that is programmable by an end user. An OTP memory array may include one or more memory cells each including one or more storage devices (e.g., FGMOS). Non-volatile memory such as an OTP memory stores binary data representative of firmware code and/or low-level programs that are for read-only access. In the event such firmware code and/or any low-level programs are to be utilized, the corresponding memory bits stored in the memory cells may be sensed and/or otherwise read for use in a volatile memory or elsewhere in a computing system and/or computing device.

Some types of non-volatile memory (e.g., OTP memory) are programmed utilizing hot carrier injection. When utilizing hot carrier injection, a voltage (e.g., 8 volts (V)) higher than the rating (e.g., 5 V) of a storage device (e.g., an FGMOS) is applied to the storage device for a period of time. To avoid destroying and/or damaging the storage device, the voltage rating of the storage device is selected such that the voltage rating is high enough to withstand the higher voltage for the duration of the period. Non-volatile memory, and memory in general, often includes a multiplexer or other circuitry to read and/or otherwise sense the bit values stored in the memory cells. Because these multiplexers and/or other circuitry are coupled to the memory cells, they are similarly rated for higher voltage.

However, when reading a non-volatile memory cell (e.g., an OTP memory cell), a voltage (e.g., 1.5 V) that is lower than the voltage rating (e.g., 5 V) is utilized to conserve power. However, due to the higher voltage rating of the storage device (e.g., the FGMOS), read operations are slower, especially at the limits of the operating area of the memory.

FIG. 1 is a schematic illustration 100 of a first OTP memory array 102, a second OTP memory array 104, a multiplexer 106, and a sensing circuit 108. In FIG. 1, the first OTP memory array 102 includes a first OTP memory cell 110 and a second OTP memory cell 112. Likewise, in FIG. 1, the second OTP memory array 104 includes a third OTP memory cell 114 and a fourth OTP memory cell 116.

In FIG. 1, the first OTP memory cell 110, the second OTP memory cell 112, the third OTP memory cell 114, and the fourth OTP memory cell 116 include respective positive channel (p-channel) MOSFET (PMOS) 118, 120, 122, 124 (e.g., positive channel switch(es)). Furthermore, the first OTP memory cell 110, the second OTP memory cell 112, the third OTP memory cell 114, and the fourth OTP memory cell 116 include respective FGMOS switches 126, 128, 130, 132. In FIG. 1, a controller 134 is operable to load a respective memory bit in any of the first OTP memory cell 110, the second OTP memory cell 112, the third OTP memory cell 114, and/or the fourth OTP memory cell 116 via a first word line (line 105) or a second word line (line 107).

In FIG. 1, the multiplexer 106 is a two-to-one passthrough multiplexor including a first array PMOS switch 136, a first array (negative channel) n-channel MOSFET (NMOS) switch 138 (e.g., a negative channel switch), a second array PMOS switch 140, a second array NMOS switch 142, and a decoder 144. The multiplexer 106 is operable based on a memory address value associated with the control signal (line 113), as decoded by the decoder 144, to either conduct current through the first array PMOS switch 136 and the first array NMOS switch 138 or conduct current through the second array PMOS switch 140 and the second array NMOS switch 142.

In order to read the bit value stored in a selected one of the first OTP memory cell 110, the second OTP memory cell 112, the third OTP memory cell 114, or the fourth OTP memory cell 116, the controller 134 generates the control signal (line 113) for use by the multiplexer 106 to enable and/or disable the respective first array PMOS switch 136, the first array NMOS switch 138, the second array PMOS switch 140, or the second array NMOS switch 142. At substantially the same time (e.g., within microseconds), a reference signal (line 115) is transmitted to a reference current generator 146. In operation, the reference signal (line 115) indicates to the reference current generator 146 to generate a reference current ($I_{REF}$) for the sensing circuit 108. Likewise, the multiplexer 106, based on the memory address value associated with the control signal (line 113) and whether a memory bit is stored in a selected one of the first OTP memory cell 110, the second OTP memory cell 112, the third OTP memory cell 114, or the fourth OTP memory cell 116, conducts a bit current ($I_{BIT}$).

In FIG. 1, each of the multiplexer 106, the first OTP memory cell 110, the second OTP memory cell 112, the third OTP memory cell 114, and the fourth OTP memory cell 116 are rated for a substantially higher voltage than the sensing circuit 108, the reference current generator 146, and the computing system 148 (e.g., 5 V vs. 1.5 V).

In FIG. 1, when executing a read operation of a memory bit stored in one or more of the first OTP memory cell 110, the second OTP memory cell 112, the third OTP memory cell 114, or the fourth OTP memory cell 116, the controller 134 generates the control signal (line 113) for use by the decoder 144. Based on the control signal (line 113), the decoder 144 generates at least one signal to operate the multiplexer 106 at a substantially lower voltage than the voltage rating of the multiplexer 106 (e.g., 1.5 V vs. 5 V). Due to the fabrication process of one or more of the first array PMOS switch 136, the first array NMOS switch 138, the second array PMOS switch 140, and the second array NMOS switch 142, the threshold voltage ($V_t$) of one or more of the first array PMOS switch 136, the first array NMOS switch 138, the second array PMOS switch 140, and the second array NMOS switch 142 is higher than the threshold voltage of lower rated components. Thus, to enable conduction of the bit current ($I_{BIT}$) through the multiplexer 106 the voltage level of the control signal (line 113) and/or the resultant signals generated by the decoder 144 should be sufficiently high to saturate one or more of the first array PMOS switch 136, the first array NMOS switch 138, the second array PMOS switch 140, and the second array NMOS switch 142.

In FIG. 1, because the voltage of the control signal (line 113) and the resultant signal and/or signals generated by the decoder 144 is not sufficiently high enough to saturate one or more of the first array PMOS switch 136, the first array NMOS switch 138, the second array PMOS switch 140, and the second array NMOS switch 142 of the multiplexer 106, the speed of read operations is impacted. For example, especially at the limits of the operating area of the multiplexer 106, read operations can be impacted so much so as to impede the functionality of the multiplexer. More specifically, the access time (e.g., the time it takes to read and/or sense the data, instructions, and information stored in the first OTP memory array 102 or the second OTP memory array 104) and the cycle time (e.g., the time between one access of either the first OTP memory array 102 or the second OTP memory array 104 and a succeeding access to the first OTP memory array 102 or the second OTP memory array 104) is dependent on the speed in which the first OTP memory array 102 or the second OTP memory array 104 can cause conduction of the bit current ($I_{BIT}$). Read operations (e.g., access times and cycles times that are above (e.g., meet) a threshold value), as illustrated in FIG. 1, may be limited to voltages of the control signal (line 113) and/or voltages of one or more signals generated by the decoder 144 at or below 1.35V. Read operations (e.g., access times and cycles times that are above (e.g., meet) a threshold value), as illustrated in FIG. 1, may be limited to temperatures that are equal to or less than −40° C.

Examples disclosed herein include methods and apparatus to improve performance while reading and/or otherwise detecting of memory bits stored in memory. In examples disclosed herein, the operating area across which read operations of an OTP memory are reliable is improved. Additionally, when utilizing the examples disclosed herein, the memory bits, instructions, and/or other information stored in the first OTP memory cell 110, the second OTP memory cell 112, the third OTP memory cell 114, and/or the fourth OTP memory cell 116 may be read by a processor, CPU, and/or other computing system without the use of an additional volatile memory architecture.

Figure 2:
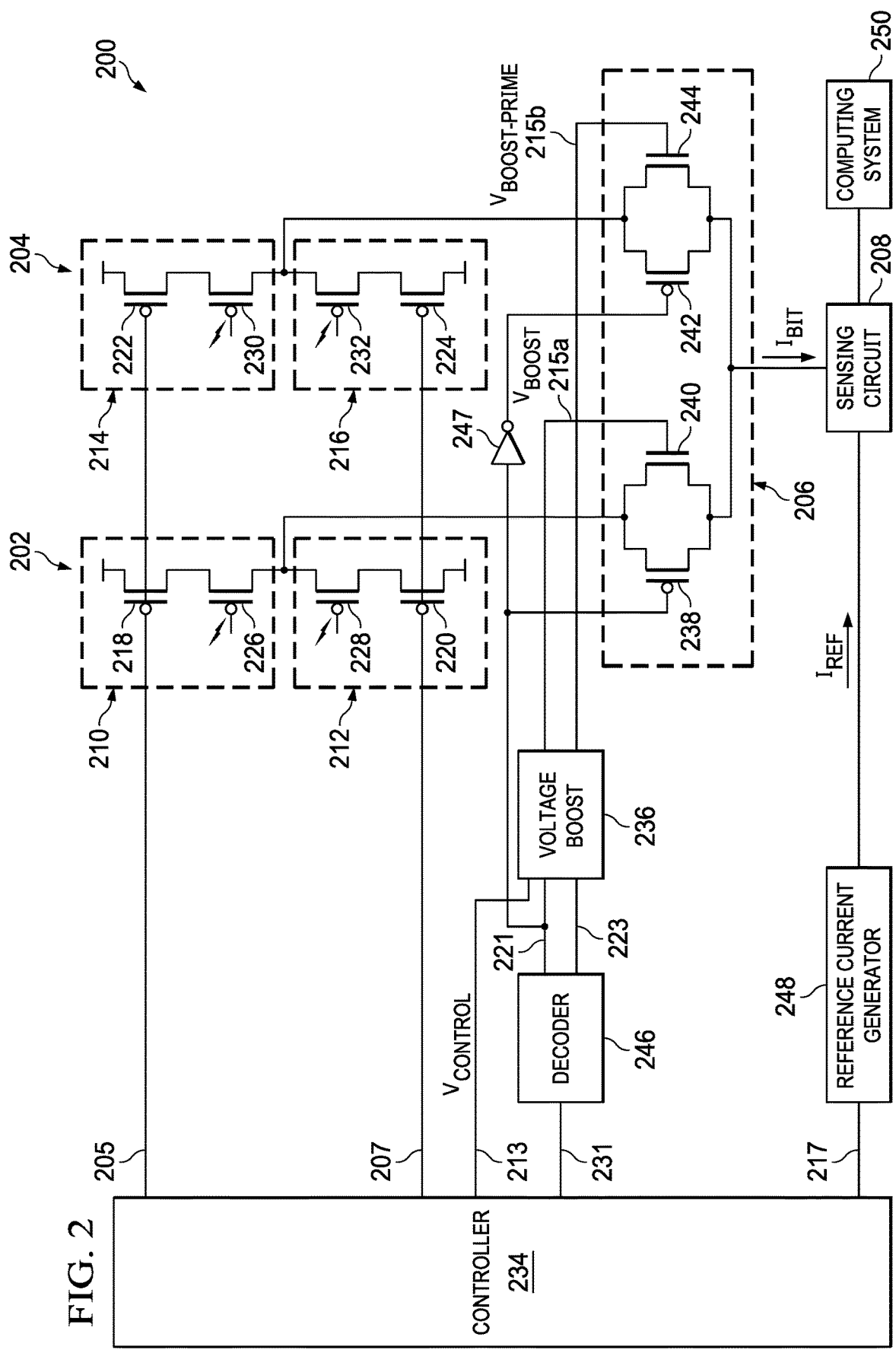
FIG. 2 is a schematic illustration of an example first OTP memory array, an example second OTP memory array, an example multiplexer, an example sensing circuit, and an example voltage boost circuit to improve performance while reading one or more of the first OTP memory array 202 and/or the second OTP memory array 204.

FIG. 2 is a schematic illustration 200 of an example first OTP memory array 202, an example second OTP memory array 204, an example multiplexer 206, an example sensing circuit 208, and an example voltage boost circuit 236 to improve performance while reading one or more of the first OTP memory array 202 and/or the second OTP memory array 204. In FIG. 2, the first OTP memory array 202 includes an example first OTP memory cell 210 and an example second OTP memory cell 212. Likewise, in FIG. 2, the second OTP memory array 204 includes an example third OTP memory cell 214 and an example fourth OTP memory cell 216. The schematic illustration 200 of FIG. 2 also includes an example controller 234, an example voltage boost circuit 236, an example decoder 246, an example inverter 247, an example reference current generator 248, and an example computing system 250. In other examples disclosed herein, there may be any number of OTP memory arrays configured in the schematic illustration 200.

In FIG. 2, the first OTP memory cell 210, the second OTP memory cell 212, the third OTP memory cell 214, and the fourth OTP memory cell 216 include respective PMOS 218, 220, 222, 224. Furthermore, the first OTP memory cell 210, the second OTP memory cell 212, the third OTP memory cell 214, and the fourth OTP memory cell 216 include respective FGMOS switches 226, 228, 230, 232. In FIG. 2, the controller 234 is operable to load a respective memory bit into any of the first OTP memory cell 210, the second OTP memory cell 212, the third OTP memory cell 214, and/or the fourth OTP memory cell 216 via an example first word line (line 205) or an example second word line (line 207). In the example illustrated in FIG. 2, in response to the generation of a logic low on any of the first word line (line 205) or the second word line (line 207), a charge is stored in the floating gate of the respective FGMOS switches 226, 228, 230, 232.

In the example of FIG. 2, the first OTP memory array 202, the second OTP memory array 204, and the multiplexer 206 are rated for a higher voltage (e.g., 5 volts) than the voltage rating of the sensing circuit 208 and the reference current generator 248 (e.g., 1.5 volts). While FIG. 2 illustrates the first OTP memory array 202, the second OTP memory array 204, and the multiplexer 206 rated for a higher voltage (e.g., 5 volts) than the voltage rating of the sensing circuit 208 and the reference current generator 248 (e.g., 1.5 volts), any suitable voltage ratings may be utilized to implement the first OTP memory array 202, the second OTP memory array 204, the multiplexer 206, the sensing circuit 208, and/or the reference current generator 248.

In FIG. 2, the multiplexer 206 is a two-to-one passthrough multiplexor including an example first array PMOS switch 238, an example first array NMOS switch 240, an example second array PMOS switch 242, and an example second array NMOS switch 244. The first array PMOS switch 238 includes a gate (e.g., a control terminal) coupled to the output of the decoder 246 (e.g., the first select signal (line 221)), a source (e.g., a current terminal) coupled to the first OTP memory cell 210 and the second OTP memory cell 212, and a drain (e.g., a current terminal) coupled to the sensing circuit 208. The first array NMOS switch 240 includes a gate (e.g., a control terminal) coupled to the output of the voltage boost circuit 236 (e.g., the boosted control signal (line 215a)), a drain (e.g., a current terminal) coupled to the first OTP memory cell 210 and the second OTP memory cell 212, and a source (e.g., a current terminal) coupled to the sensing circuit 208. The second array PMOS switch 242 includes a gate (e.g., a control terminal) coupled to the output of the inverter 247, a source (e.g., a current terminal) coupled to the third OTP memory cell 214 and the fourth OTP memory cell 216, and a drain (e.g., a current terminal) coupled to the sensing circuit 208. The second array NMOS switch 244 includes a gate (e.g., a control terminal) coupled to the output of the voltage boost circuit 236 (e.g., the complimented boosted control signal (line 215b)), a drain (e.g., a current terminal) coupled to the third OTP memory cell 214 and the fourth OTP memory cell 216, and a source (e.g., a current terminal) coupled to the sensing circuit 208.

In the example of FIG. 2, the multiplexer 206 is operable based on a polarity of example select signals (lines 221, 223) generated by the decoder 246 and/or an example boosted control signal (line 215a) and/or an example complimented boosted control signal (line 215b) generated by the voltage boost circuit 236. In operation, the controller 234 transmits an example control signal (line 213) to the voltage boost circuit 236 and the voltage boost circuit 236 generates and transmits the example boosted control signal (line 215a) and/or the example complimented boosted control signal (line 215b) to the multiplexer 206 based on the polarity of the select signals (lines 221, 223). Additionally, the controller 234 transmits an example decode signal (line 231) to the decoder 246. As a result, the decoder 246 generates the selects signals (lines 221, 223) based on the decode signal (line 231) to either cause, in conjunction with the boosted control signal (line 215a) and/or the complimented boosted control signal (line 215b), conduction of current through the first array PMOS switch 238 and the first array NMOS switch 240 or conduction of current through the second array PMOS switch 242 and the second array NMOS switch 244.

For example, if the first word line (line 205) is a logic low value, the second word line (line 207) is a logic high value, the first select signal (line 221) is a logic high value, the second select signal (line 223) is a logic low value, and the control signal (line 213) is a logic high value, then the boosted control signal (line 215a) is a logic low value, the voltage level of the complimented boosted control signal (line 215b) is boosted and a memory bit, if any, stored in the third OTP memory cell 214 is to be sensed and/or otherwise read. Further in such an example, if a memory bit is stored in the third OTP memory cell 214 and the select signals (lines 221, 223) and/or the control signal (line 213) indicate to sense and/or otherwise read the memory bit stored in the third OTP memory cell 214, an example bit current ($I_{BIT}$) will conduct through the second array PMOS switch 242 and the second array NMOS switch 244.

Alternatively, in another example disclosed herein, if the first word line (line 205) is a logic high value, the second word line (line 207) is a logic low value, the first select signal (line 221) is a logic low value, the second select signal (line 223) is a logic high value, and the control signal (line 213) is a logic high value, then, the voltage level of the boosted control signal (line 215a) is boosted, the complimented boosted control signal (line 215b) is a logic low value, and a memory bit, if any, stored in the second OTP memory cell 212 is to be sensed and/or otherwise read. Further in such an example, if a memory bit is stored in the second OTP memory cell 212 and the select signals (lines 221, 223) and/or the control signal (line 213) indicate to sense and/or otherwise read the memory bit stored in the second OTP memory cell 212, the bit current ($I_{BIT}$) will conduct through the first array PMOS switch 238 and the first array NMOS switch 240. In examples disclosed herein, the magnitude of the bit current ($I_{BIT}$) if a memory bit is stored in a selected one of the first OTP memory cell 210, the second OTP memory cell 212, the third OTP memory cell 214, or the fourth OTP memory cell 216 may be 0.5 milliamperes, 1.0 milliamperes, etc. Table 1 below illustrates example voltage values when reading a memory cell of the first OTP memory array 202.

TABLE 1

| Signal | Voltage Level (Volts) |
|---|---|
| Control Signal (line 213) | 1.5 |
| Boosted Control Signal (line 215a) | 2.4 |
| Complimented Boosted Control Signal (line 215b) | 0 |
| First Select Signal (line 221) | 0 |
| Second Select Signal (line 223) | 1.5 |
| Decode Signal (line 231) | 0 |

Table 2 below illustrates example voltage values when reading a memory cell of the second OTP memory array 204.

TABLE 2

| Signal | Voltage Level (Volts) |
|---|---|
| Control Signal (line 213) | 1.5 |
| Boosted Control Signal (line 215a) | 0 |
| Complimented Boosted Control Signal (line 215b) | 2.4 |
| First Select Signal (line 221) | 1.5 |
| Second Select Signal (line 223) | 0 |
| Decode Signal (line 231) | 1 |

In the example illustrated in FIG. 2, the sensing circuit 208 is operable to sense and/or otherwise read memory bits, if any, stored in a selected one of the first OTP memory cell 210, the second OTP memory cell 212, the first OTP memory cell 210. In the example of FIG. 2, if a memory bit is stored in a selected one of the first OTP memory cell 210, the second OTP memory cell 212, the third OTP memory cell 214, or the fourth OTP memory cell 216, and such corresponding memory cell is selected to be sensed and/or otherwise read via the select signals (lines 221, 223) and/or the control signal (line 213), the bit current ($I_{BIT}$) conducts through the multiplexer 206.

In the example illustrated in FIG. 2, the controller 234 is coupled to the first OTP memory cell 210, the second OTP memory cell 212, the third OTP memory cell 214, the fourth OTP memory cell 216, the voltage boost circuit 236, the decoder 246, and to the reference current generator 248. In examples disclosed herein, the controller 234 is implemented as a single controller operable to, at least, load a memory bit in any of the first OTP memory cell 210, the second OTP memory cell 212, the third OTP memory cell 214, and/or the fourth OTP memory cell 216, select via the control signal (line 213) and/or the decode signal (line 231) which of the first OTP memory cell 210, the second OTP memory cell 212, the third OTP memory cell 214 or the fourth OTP memory cell 216 to sense and/or otherwise read, and/or generate and/or otherwise cause to generate a reference current via the reference signal (line 217). In the example of FIG. 2, the controller 234 is a CPU including a memory controller. In other examples disclosed herein, any number of suitable controllers may be configured to perform the operations of the controller 234.

In FIG. 2, the controller 234 is operable to load a memory bit into any of the first OTP memory cell 210, the second OTP memory cell 212, the third OTP memory cell 214, and/or the fourth OTP memory cell 216 based on the logic values on the first word line (line 205) or the second word line (line 207). In such an example, a user may indicate certain programs and/or low-level code to be translated into binary digital data by the controller 234 and stored in a selected one of the first OTP memory cell 210, the second OTP memory cell 212, the third OTP memory cell 214, and/or the fourth OTP memory cell 216. The controller 234 is operable to generate and/or otherwise provide the control signal (line 213) and/or the decode signal (line 231) to the voltage boost circuit 236 and/or the decoder 246 to indicate which of the first OTP memory cell 210, the second OTP memory cell 212, the third OTP memory cell 214, or the fourth OTP memory cell 216 are to be sensed and/or otherwise read (e.g., sense the memory bits, if any). Moreover, the controller 234 is operable to generate and/or otherwise provide the reference signal (line 217) to the reference current generator 248 to generate the reference current ($I_{REF}$). Further operation of the controller 234 is explained below in connection with FIG. 3.

In the illustrated example of FIG. 2, the voltage boost circuit 236 is a circuit that applies a boost to the voltage level ($V_{CONTROL}$) of the control signal (line 213) and/or the select signals (lines 221, 223). For example, if the voltage level of the control signal (line 213) is 1.5 V, the voltage boost circuit 236 applies voltage boost of about 500-900 millivolt (mV) to the control signal (line 213). The resultant control signal, either the boosted control signal (line 215a) or the complimented boosted control signal (line 215b) is selected based on the polarity of the select signal (lines 221, 223). The voltage level of the resultant control signal (e.g., the boosted control signal (line 215a) and/or the complimented boosted control signal (line 215b)) is at a voltage level ($V_{BOOST}$) between 2.0 V and 2.4 V. Further operation of the voltage boost circuit 236 is explained below in connection with FIG. 4.

In FIG. 2, the example reference current generator 248 sensing circuit 208 and the controller 234. In examples disclosed herein, the reference current generator 248 is implemented external to the controller 234. Alternatively, in other examples disclosed herein, the reference current generator 248 may be implemented internal to the controller 234. The reference current generator 248 is configured to obtain and/or otherwise receive the reference signal (line 217) that indicates the desired magnitude of the reference current ($I_{REF}$). For example, the reference signal (line 217) may indicate a desired reference current ($I_{REF}$) of 0.1 milliamperes (mA) and, as such, the reference current generator 248 is configured to generate the reference current ($I_{REF}$) at the desired current of 0.1 mA. In some examples disclosed herein, the sensing circuit 208 may be included in the controller 234.

In the example illustrated in FIG. 2, the computing system 250 is coupled to the output of the sensing circuit 208. In examples disclosed herein, the computing system 250 may be a volatile memory configured to receive the indication of the sensed and/or otherwise read memory bit. In such examples disclosed herein, the computing system 250 can download and/or otherwise load the memory bits from any of the first OTP memory cell 210, the second OTP memory cell 212, the third OTP memory cell 214, and/or the fourth OTP memory cell 216 for reprogramming, use, and/or any other suitable application. In other examples disclosed herein, the computing system 250 may be a processor and/or suitable processing device structured to obtain the memory bits stored in any of the first OTP memory cell 210, the second OTP memory cell 212, the third OTP memory cell 214, and/or the fourth OTP memory cell 216.

In some examples disclosed herein, the sensing circuit 208, the voltage boost circuit 236, the reference current generator 248, and/or the decoder 246 may be included in the controller 234.

Figure 3:
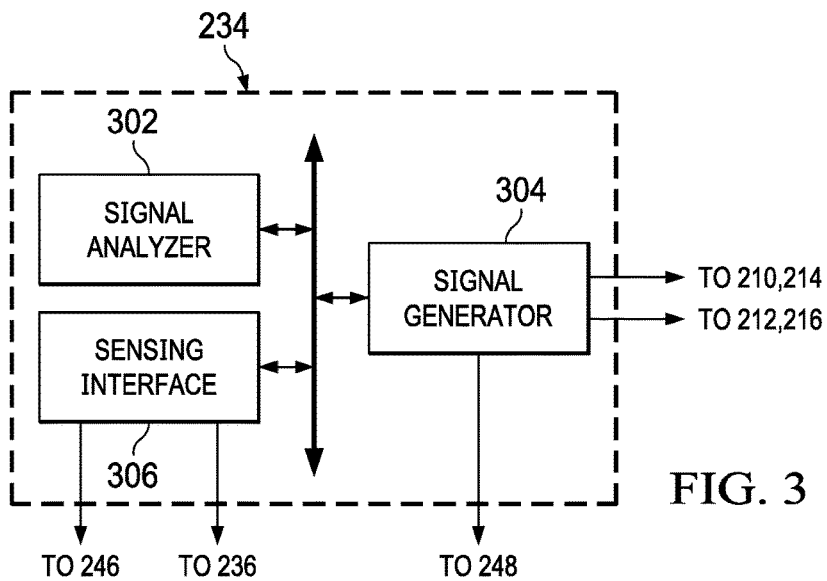
FIG. 3 is a block diagram illustrating an example implementation of the controller of FIG. 2.

FIG. 3 is a block diagram 300 illustrating the example controller 234 of FIG. 2. The controller 234 of FIG. 3 includes an example signal analyzer 302, an example signal generator 304, and an example sensing interface 306. In examples disclosed herein, any of the signal analyzer 302, the signal generator 304, and/or the sensing interface 306 may communicate via any suitable method of wired and/or wireless communication to respective devices internal to the controller 234 and/or external to the controller 234.

In the example illustrated in FIG. 3, the signal analyzer 302 is configured to determine whether an indication to sense and/or read memory bits is obtained and/or otherwise received. In FIG. 3, the signal analyzer 302 operates in the controller 234 based on pre-initialized commands that indicate to sense and/or otherwise read memory bits. For example, during boot-up of the controller 234, the signal analyzer 302 may respond to a pre-initialized command that indicates to sense and/or otherwise read a memory bit stored in the non-volatile memory (e.g., the first OTP memory cell 210, the second OTP memory cell 212, the third OTP memory cell 214, or the fourth OTP memory cell 216). In other examples disclosed herein, the signal analyzer 302 may be configured to determine whether an indication to sense and/or read memory bits is obtained based on communication with a user interface and/or any suitable input apparatus. In response to the indication to sense and/or read memory bits, the signal analyzer 302 analyzes the indication to determine which of the first OTP memory cell 210, the second OTP memory cell 212, the third OTP memory cell 214, or the fourth OTP memory cell 216 are to be accessed for sensing and/or reading. In examples disclosed herein, the signal analyzer 302 may be a signal analyzer controller.

In the example illustrated in FIG. 3, the signal generator 304 is configured to obtain the indication and/or determination from the signal analyzer 302 to generate corresponding logic values on the signals associated with the word line for the selected memory cell to be read. For example, the signal generator 304 may generate a logic low value on the example word lines (e.g., the first word line (line 205) and/or the second word line (line 207)), to store a memory bit in any of the first OTP memory cell 210, the second OTP memory cell 212, the third OTP memory cell 214, and/or the fourth OTP memory cell 216, respectively. In addition, the signal generator 304 may generate the example reference signal (line 217) of FIG. 2 for use by the reference current generator 248 of FIG. 2. In examples disclosed herein, the signal generator 304 may be a signal generator controller.

In the example illustrated in FIG. 3, the sensing interface 306 is configured to generate the example control signal (line 213) of FIG. 2 for use by the voltage boost circuit 236 of FIG. 2. In addition, the sensing interface 306 is configured to generate the example decode signal (line 231) of FIG. 2 for use by the decoder 246 of FIG. 2. In examples disclosed herein, the sensing interface 306 is configured to generate the control signal (line 213) to cause the voltage boost circuit 236 to generate the boosted control signal (line 215a) and/or the complimented boosted control signal (line 215b). In examples disclosed herein, the sensing interface 306 may be a sensing interface controller.

In some examples disclosed herein, the signal generator 304 and/or the sensing interface 306 may be included in a memory controller. Alternatively, in other examples disclosed herein, the controller 234 may include the voltage boost circuit 236 and/or the reference current generator 248 of FIG. 2.

Figure 4:
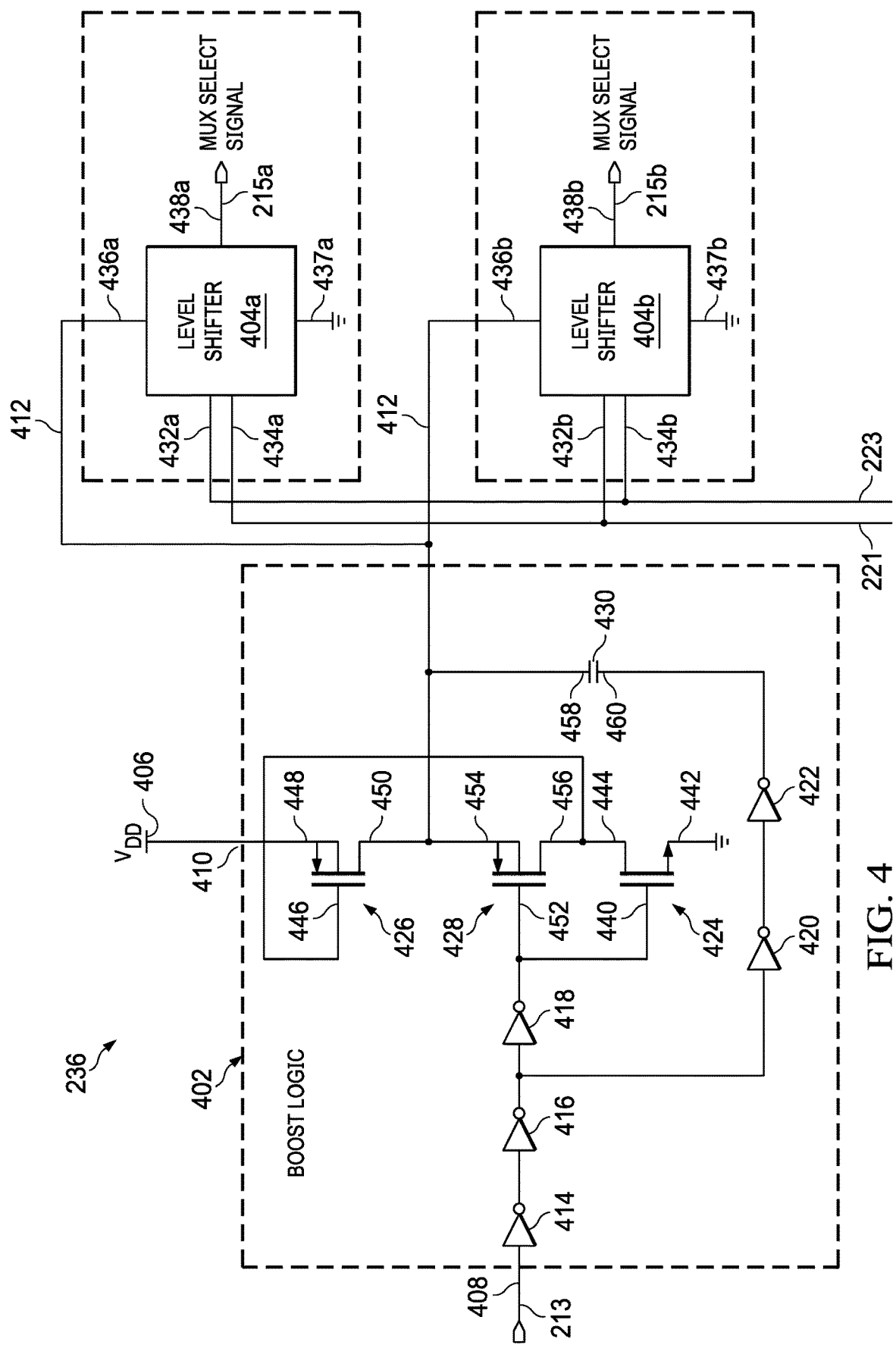
FIG. 4 is a schematic illustration showing an example implementation of the voltage boost circuit of FIG. 2.

FIG. 4 is a schematic illustration showing an example implementation of the voltage boost circuit 236 of FIG. 2. The voltage boost circuit 236 of FIG. 4 includes an example voltage boost network 402, an example first level shifter 404a, an example second level shifter 404b, and a voltage input 406. The example voltage boost network 402 includes an example first input 408, an example second input 410, and an example output 412, an example first inverter 414, an example second inverter 416, an example third inverter 418, an example fourth inverter 420, an example fifth inverter 422, an example first switch 424, an example second switch 426, an example third switch 428, and an example capacitor 430. The example first level shifter 404a includes an example first input 432a, an example second input 434a, an example third input 436a, an example fourth input 437a, and an example output 438a. The example second level shifter 404b includes an example first input 432b, an example second input 434b, an example third input 436b, an example fourth input 437b, and an example output 438b.

In the example of FIG. 4, the example first switch 424 is an NMOS transistor including an example gate 440 (e.g., a control terminal), an example source 442 (e.g., a current terminal), and an example drain 444 (e.g., a current terminal). The example second switch 426 is a PMOS transistor including an example gate 446 (e.g., a control terminal), an example source 448 (e.g., a current terminal), and an example drain 450 (e.g., a current terminal). The example third switch 428 is a PMOS transistor including an example gate 452 (e.g., a control terminal), an example source 454, and an example drain 456. The example capacitor 430 includes an example first terminal 458 (e.g., a first plate) and an example second terminal 460 (e.g., a second plate).

In the example of FIG. 4, the voltage boost network 402 is a circuit that receives the control signal (line 213) at the first input 408 and an input voltage $V_{DD}$ at the voltage input 406. For example, the voltage level at the voltage input 406 can be 1.5 volts (e.g., $V_{DD}$=1.5 V). In operation, the voltage boost network 402 boosts the voltage level of the control signal (line 213) to improve the operating area across which a controller can sense memory. For example, the voltage boost network 402 can increase the voltage level of the control signal (line 213) by 500 mV. In operation, the voltage boost network 402 outputs the boosted signal at the output 412. For example, when a controller (e.g., the controller 234) sends the control signal (line 213) and/or a decoder (e.g., the decoder 246) transmits the select signals (lines 221, 223) to read a bit from a memory array (e.g., the first OTP memory array 202, the second OTP memory array 204, etc.), the logic value of the control signal (line 213) the logic values of the select signals (lines 221, 223) can vary depending on which memory array is selected (e.g., the first OTP memory array 202 versus the second OTP memory array 204). Additionally, when a controller (e.g., the controller 234) sends the control signal (line 213) to not read a bit from a memory array, the logic value of the control signal (line 213) can be a logic low value.

In the example illustrated in FIG. 4, the first level shifter 404a is a device that receives a first input signal and shifts the voltage level of the output signal to a voltage level specified by a second input signal. In FIG. 4, the first level shifter 404a receives the second select signal (line 223) at the first input 432a and the first select signal (line 221) at the second input 434a. For examples, the first input 432a and the second input 434a are coupled to the outputs of the decoder 246. In the example of FIG. 4, the third input 436a is coupled to the output 412, the fourth input 437a is coupled to reference voltage node (e.g., GND, zero volts, etc.), and the output 438a is coupled to the first array NMOS switch 240. In operation, the first level shifter 404a receives the first select signal (line 221) at the second input 434a, the second select signal (line 223) at the first input 432a, and the signal at the output 412 of the voltage boost network 402. In operation, the first level shifter 404a shifts the voltage level of the signal at the output 438a (e.g., the boosted control signal (line 215a)) from the voltage level of the signal at the first input 432a (e.g., a logic high value or a logic low value) to the voltage level of the signal at the third input 436a (e.g., the voltage level of the signal at the output 412) when the logic values at the first input 432a (e.g., the second select signal (line 223)) and the second input 434a (e.g., the first select signal (line 221)) are a logic high value and a logic low value, respectively.

In the example illustrated in FIG. 4, the second level shifter 404b is a device that receives a first input signal and shifts the voltage level of the output signal to a voltage level specified by a second input signal. In FIG. 4, the second level shifter 404b receives the first select signal (line 221) at the first input 432b and the second select signal (line 223) at the second input 434b. For examples, the first input 432b and the second input 434b are coupled to the outputs of the decoder 246. In the example of FIG. 4, the third input 436b is coupled to the output 412, the fourth input 437b is coupled to reference voltage node (e.g., GND, zero volts, etc.), and the output 438b is coupled to the second array NMOS switch 244. In operation, the second level shifter 404b receives the first select signal (line 221) at the first input 432b, the second select signal (line 223) at the second input 434b, and the signal at the output 412 of the voltage boost network 402. In operation, the second level shifter 404b shifts the voltage level of the signal at the output 438b (e.g., the complimented boosted control signal (line 215b)) from the voltage level of the signal at the first input 432b (e.g., a logic high value or a logic low value) to the voltage level of the signal at the third input 436b (e.g., the voltage level of the signal at the output 412) when the logic values at the first input 432b (e.g., the first select signal (line 221)) and the second input 434b (e.g., the second select signal (line 223)) are a logic high value and a logic low value, respectively.

In the illustrated example of FIG. 4, each of the first inverter 414, the second inverter 416, the third inverter 418, the fourth inverter 420, and the fifth inverter 422 is a NOT gate including an input and an output. The input of the first inverter 414 is coupled to the first input 408 and the output of the first inverter 414 is coupled to the input of the second inverter 416. In operation, the first inverter 414 receives the control signal (line 213) and inverts the logic value of the control signal (line 213).

In the example illustrated in FIG. 4, the input of the second inverter 416 is coupled to the output of the first inverter 414 and the output of the second inverter 416 is coupled to the input of the third inverter 418 and the input of the fourth inverter 420. In operation, the second inverter 416 receives the signal at the output of the first inverter 414 and inverts the logic value of the signal at the output of the first inverter 414.

In the example of FIG. 4, the input of the third inverter 418 is coupled to the output of the second inverter 416 and the output of the third inverter 418 is coupled to the gate 440 of the first switch 424 and the gate 452 of the third switch 428. In operation, the third inverter 418 receives the signal at the output of the second inverter 416 and inverts the logic value of the signal at the output of the second inverter 416.

In the illustrated example of FIG. 4, the input of the fourth inverter 420 is coupled to the output of the second inverter 416 and the output of the fourth inverter 420 is coupled to the input of the fifth inverter 422. In operation, the fourth inverter 420 receives the signal at the output of the second inverter 416 and inverts the logic value of the signal at the output of the second inverter 416.

In the example illustrated in FIG. 4, the input of the fifth inverter 422 is coupled to the output of the fourth inverter 420 and the output of the fifth inverter 422 is coupled to the second terminal 460 of the capacitor 430. In operation, the fifth inverter 422 receives the signal at the output of the fourth inverter 420 and inverts the logic value of the signal at the output of the fourth inverter 420.

In the example of FIG. 4, the gate 440 of the first switch 424 is coupled to the output of the third inverter 418 and the gate 452 of the third switch 428. The source 442 of the first switch 424 is coupled to the reference voltage node (e.g., GND, zero volts, etc.). The drain 444 of the first switch 424 is coupled to the drain 456 of the third switch 428 and the gate 446 of the second switch 426. In operation, during a read operation of the memory array (e.g., the first OTP memory array 202, the second OTP memory array 204, etc.), the logic value at the gate 440 of the first switch 424 can be a logic low value. Additionally, when not reading a bit from a memory array, the logic value at the gate 440 of the first switch 424 can be a logic high value.

As such, prior to a read operation of a memory array (e.g., the first OTP memory array 202, the second OTP memory array 204, etc.), the first switch 424 is enabled and the voltage level at the drain 450 of the first switch 424 can correspond to zero volts. During a read operation of a memory array (e.g., the first OTP memory array 202, the second OTP memory array 204), the first switch 424 is disabled.

In the example of FIG. 4, the gate 446 of the second switch 426 is coupled to the drain 444 of the first switch 424 and the drain 456 of the third switch 428. The source 448 of the second switch 426 is coupled to the voltage input 406 (e.g., $V_{DD}$) via the second input 410. The drain 450 of the second switch 426 is coupled to the source 454 of the third switch 428 and the first terminal 458 (e.g., the output 412) of the capacitor 430. In operation, during a read operation of a memory array (e.g., the first OTP memory array 202, the second OTP memory array 204, etc.), the logic value at the gate 446 of the second switch 426 can be floating (e.g., at an indeterminant voltage level, not at a voltage level of zero, etc.). Additionally, when not reading a bit from a memory array (e.g., the first OTP memory array 202, the second OTP memory array 204, etc.), the logic value at the gate 446 of the second switch 426 can be a logic low value.

As such, prior to a read operation of a memory array (e.g., the first OTP memory array 202, the second OTP memory array 204, etc.), the second switch 426 is enabled and the voltage level at the drain 450 of the second switch 426 can correspond to the voltage level at the voltage input 406 (e.g., $V_{DD}$). During a read operation of a memory array (e.g., the first OTP memory array 202, the second OTP memory array 204, etc.), the second switch 426 is disabled.

In the example of FIG. 4, the gate 452 of the third switch 428 is coupled to the output of the third inverter 418 and the gate 440 of the first switch 424. The source 454 of the third switch 428 is coupled to the drain 450 of the second switch 426 and the first terminal 458 of the capacitor 430 (e.g., the output 412). The drain 456 of the third switch 428 is coupled to the gate 446 of the second switch 426 and the drain 444 of the first switch 424. In operation, during a read operation of a memory array (e.g., the first OTP memory array 202, the second OTP memory array 204, etc.), the logic value at the gate 452 of the third switch 428 can be a logic low value. Additionally, when not reading a bit from a memory array (e.g., the first OTP memory array 202, the second OTP memory array 204, etc.), the logic value at the gate 452 of the third switch 428 can be a logic high value.

As such, prior to a read operation of a memory array (e.g., the first OTP memory array 202, the second OTP memory array 204, etc.), the third switch 428 is disabled. During a read operation of a memory array (e.g., the first OTP memory array 202, the second OTP memory array 204, etc.), the third switch 428 is enabled and the voltage level at the source 454 of the third switch 428 can be floating and dependent upon the voltage level at the first terminal 458 of the capacitor 430.

In the example of FIG. 4, the capacitor 430 is a bulk capacitor. The first terminal 458 of the capacitor 430 is coupled to the output 412, the source 454 of the third switch 428, and the drain 450 of the second switch 426. In operation, the capacitor 430 charges based on the voltage level at the drain 450 of the second switch 426. In operation, voltage level at the second terminal 460 of the capacitor 430 serves as a reference voltage level for the output 412. For example, when a controller (e.g., the controller 234) sends the control signal (line 213) to read a bit from a memory array (e.g., the first OTP memory array 202, the second OTP memory array 204, etc.), the logic value of the control signal (line 213) can be a logic high value. As such, the voltage level at the second terminal 460 of the capacitor 430 can be the voltage level of a logic high value. Additionally, when not reading a bit from a memory array (e.g., the first OTP memory array 202, the second OTP memory array 204, etc.), the logic value of the control signal (line 213) can be a logic low value. As such, the voltage level at the second terminal 460 of the capacitor 430 can be at zero volts.

Additionally, when not reading a bit from a memory array (e.g., the first OTP memory array 202, the second OTP memory array 204, etc.), the voltage value at the first terminal 458 (e.g., the output 412) can be equal to the voltage level at the voltage input 406 (e.g., $V_{DD}$) and the voltage level at the second terminal 460 can be a logic low value (e.g., zero volts). As such, prior to a read operation of a memory array (e.g., the first OTP memory array 202, the second OTP memory array 204, etc.), the capacitor 430 can be charged to the voltage level of the voltage input 406 (e.g., $V_{DD}$). When the controller (e.g., the controller 234), transmits a logic high value as the control signal (line 213) (e.g., initiates a read operation), the control signal (line 213) transitions from a logic low value to a logic high value. The rising edge on the control signal (line 213) increases the voltage level at the second terminal 460 of the capacitor 430 to a logic high value before the capacitor 430 discharges. As such, voltage level at the first terminal 458 of the capacitor 430 (e.g., the output 412) is boosted while the capacitor 430 discharges.

Furthermore, because the voltage level of the signal at the output 412 is boosted by the rising edge of the control signal (line 213), the first level shifter 404a and/or the second level shifter 404b correspondingly boosts the voltage level of the boosted control signal (line 215a) and/or the complimented boosted control signal (line 215b), respectively, to the multiplexer 206. As such, the operating area across which read operations of memory arrays (e.g., the first OTP memory array 202, the second OTP memory array 204, etc.) are reliable is improved. For example, because the voltage level of the signal at the output 412 is boosted, one or more of the first array NMOS switch 240 or the second array NMOS switch 244 can be more fully saturated. Thus, a bit current ($I_{BIT}$) can be more reliably sensed by a sensing circuit (e.g., the sensing circuit 208) and the operating area across which read operations of memory arrays is improved. Additionally, as a result of the boosted voltage level at the output 412 of the voltage boost network 402, the memory bits, instructions, and/or other information stored in memory arrays (e.g., the first OTP memory array 202, the second OTP memory array 204, etc.) may be read by a processor, CPU, and/or other computing system without the use of an additional volatile memory architecture.

Figure 5:
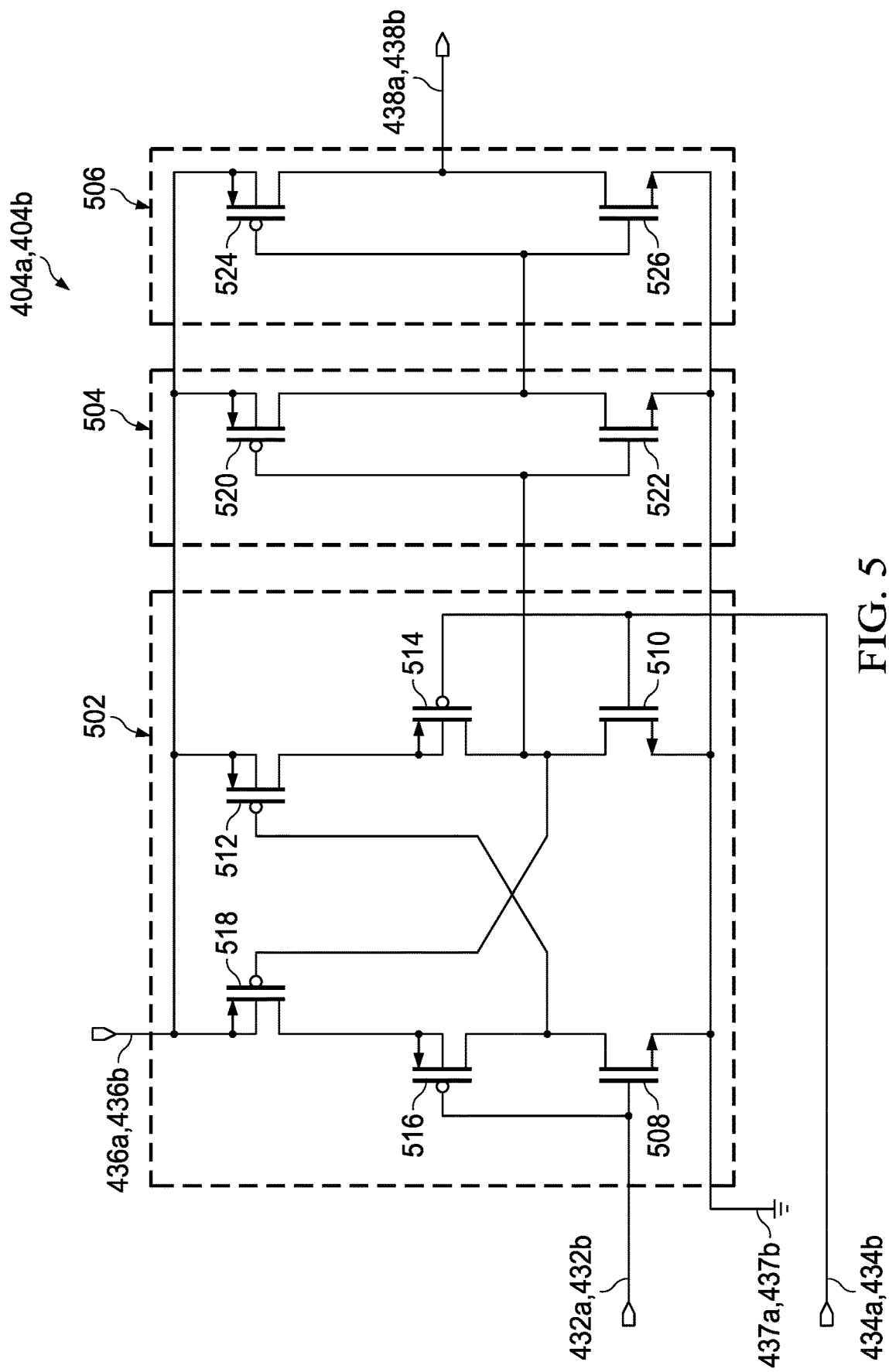
FIG. 5 is a schematic illustration showing further detail of an example implementation of the level shifter of FIG. 4.

FIG. 5 is a schematic illustration showing further detail of an example implementation of the first level shifter 404a and/or the second level shifter 404b of FIG. 4. The example first level shifter 404a and/or the example second level shifter 404b includes an example shifting network 502, an example first inverter 504, and an example second inverter 506. The example shifting network 502 includes a first switch 508, a second switch 510, a third switch 512, a fourth switch 514, a fifth switch 516, and a sixth switch 518. The example first inverter 504 includes an example seventh switch 520 and an example eighth switch 522. The example second inverter 506 includes an example ninth switch 524 and an example tenth switch 526.

In the example of FIG. 5, each of the first switch 508, the second switch 510, the eighth switch 522, and the tenth switch 526 is an NMOS transistor including an example gate (e.g., a control terminal), an example drain (e.g., a current terminal), and an example source (e.g., a current terminal). Additionally, each of the third switch 512, the fourth switch 514, the fifth switch 516, the sixth switch 518, the seventh switch 520, and the ninth switch 524 is a PMOS transistor including an example gate (e.g., a control terminal), an example drain (e.g., a current terminal), and an example source (e.g., a current terminal).

In the example illustrated in FIG. 5, the gate of the first switch 508 is coupled to the first input 432a of the first level shifter 404a and/or the first input 432b of the second level shifter 404b and the gate of the fifth switch 516. The gate of the first switch 508 receives the signal at the first input 432a (e.g., the second select signal (line 223)) and/or the first input 432b (e.g., the first select signal (line 221)). The drain of the first switch 508 is coupled to the drain of the fifth switch 516 and the gate of the third switch 512. The source of the first switch 508 is coupled to a reference voltage node (e.g., GND, zero volts, etc.) at the fourth input 437a and/or the fourth input 437b.

In the illustrated example of FIG. 5, the gate of the second switch 510 is coupled to the second input 434a and/or the second input 434b and the gate of the fourth switch 514. The gate of the second switch 510 receives the signal at the second input 434a (e.g., the first select signal (line 221)) and/or the second input 434b (e.g., the second select signal (line 223)). The drain of the second switch 510 is coupled to the drain of the fourth switch 514, the gate of the sixth switch 518, the gate of the seventh switch 520, and the gate of the eighth switch 522. The source of the second switch 510 is coupled to a reference voltage node (e.g., GND, zero volts, etc.) at the fourth input 437a and/or the fourth input 437b.

In the example illustrated in FIG. 5, the gate of the third switch 512 is coupled to the drain of the first switch 508 and the drain of the fifth switch 516. The drain of the third switch 512 is coupled to the source of the fourth switch 514 and the source of the third switch 512 is coupled to the third input 436a and/or the third input 436b and receives the signal at the output 412.

In the example illustrated in FIG. 5, the gate of the fourth switch 514 is coupled to the gate of the second switch 510 and the second input 434a and/or the second input 434b. The gate of the fourth switch 514 receives the signal at the second input 434a (e.g., the first select signal (line 221)) and/or the second input 434b (e.g., the second select signal (line 223)). The drain of the fourth switch 514 is coupled to the drain of the second switch 510, the gate of the sixth switch 518, the gate of the seventh switch 520, and the gate of the eighth switch 522. The source of the fourth switch 514 is coupled to the drain of the third switch 512.

In the example of FIG. 5, the gate of the fifth switch 516 is coupled to the gate of the first switch 508 and the first input 432a and/or the first input 432b. The gate of the fifth switch 516 receives the signal at the first input 432a (e.g., the second select signal (line 223)) and/or the first input 432b (e.g., the first select signal (line 221)). The drain of the fifth switch 516 is coupled to the drain of the first switch 508 and the gate of the third switch 512. The source of the fifth switch 516 is coupled to the drain of the sixth switch 518.

In the example illustrated in FIG. 5, the gate of the sixth switch 518 is coupled to the drain of the second switch 510, the drain of the fourth switch 514, the gate of the seventh switch 520, and the gate of the eighth switch 522. The drain of the sixth switch 518 is coupled to the source of the fifth switch 516 and the source of the sixth switch 518 is coupled to the third input 436a and/or the third input 436b and receives the signal at the output 412.

In operation, the voltage level of the signal at the third input 436a and/or the third input 436b can correspond to the voltage level of the signal at the voltage input 406 (e.g., $V_{DD}$) and/or a boosted voltage level caused by a rising edge on the second terminal 460 of the capacitor 430 as the capacitor 430 discharges. The first switch 508 can be enabled and/or disabled based on the logic value of the signal at the first input 432a and/or the first input 432b. The second switch 510 is disabled. Additionally, the third switch 512 can be enabled and/or disabled based on the operation of the first switch 508 and/or the fifth switch 516. The fourth switch 514 is enabled. Moreover, the fifth switch 516 can be enabled and/or disabled based on the logic value of the signal at the first input 432a and/or the first input 432b. The sixth switch 518 can be enabled and/or disabled based on the operation of the second switch 510 and/or the fourth switch 514.

For example, when the shifting network 502 receives a logic high value at the first input 432a and/or the first input 432b, the first switch 508 is enabled and the logic value at the gate of the third switch 512 is a logic low value, enabling the third switch 512. As the second switch 510 is disabled and the fourth switch 514 is enabled, the voltage level at the drain of the second switch 510, the drain of the fourth switch 514, the gate of the sixth switch 518, the gate of the seventh switch 520, and the gate of the eighth switch 522 is set to the voltage level of the signal at the third input 436a and/or the third input 436b.

When the shifting network 502 receives a logic low value at the first input 432a and/or the first input 432b, the first switch 508 is disabled, the fifth switch 516 is enabled and the logic value at the gate of the third switch 512 can be floating (e.g., at an indeterminant voltage level, not at a voltage level of zero, etc.). As such, the voltage level at the drain of the second switch 510, the drain of the fourth switch 514, the gate of the sixth switch 518, the gate of the seventh switch 520, and the gate of the eighth switch 522 can be floating (e.g., at an indeterminant voltage level, not at a voltage level of zero, etc.).

In the example illustrated in FIG. 5, the gate of the seventh switch 520 is coupled to the drain of the second switch 510, the drain of the fourth switch 514, the gate of the sixth switch 518, and the gate of the eighth switch 522. The drain of the seventh switch 520 is coupled to the drain of the eighth switch 522, the gate of the ninth switch 524, and the gate of the tenth switch 526. The source of the seventh switch 520 is coupled to the third input 436a and/or the third input 436b and receives the signal at the output 412.

In the example of FIG. 5, the gate of the eighth switch 522 is coupled to the drain of the second switch 510, the drain of the fourth switch 514, the gate of the sixth switch 518, and the gate of the seventh switch 520. The drain of the eighth switch 522 is coupled to the drain of the seventh switch 520, the gate of the ninth switch 524, and the gate of the tenth switch 526. The source of the eighth switch 522 is coupled to the second input 434a and/or the second input 434b and receives the first select signal (line 221) and/or the second select signal (line 223).

When the first inverter 504 receives a logic high value at the gate of the seventh switch 520 and the gate of the eighth switch 522, the eighth switch 522 is enabled and the voltage level at the drain of the seventh switch 520, the drain of the eighth switch 522, the gate of the ninth switch 524, and the gate of the tenth switch 526 is a logic low value. When the first inverter 504 receives a logic low value at the gate of the seventh switch 520 and the gate of the eighth switch 522, the seventh switch 520 is enabled and the voltage level at the drain of the seventh switch 520, the drain of the eighth switch 522, the gate of the ninth switch 524, and the gate of the tenth switch 526 is the voltage level of the signal at the third input 436a and/or the third input 436b.

In the example illustrated in FIG. 5, the gate of the ninth switch 524 is coupled to the drain of the seventh switch 520 and the drain of the eighth switch 522. The drain of the ninth switch 524 is coupled to the drain of the tenth switch 526 and the output 438a and/or the output 438b. The source of the ninth switch 524 is coupled to the third input 436a and/or the third input 436b and receives the signal at the output 412.

In the example of FIG. 5, the gate of the tenth switch 526 is coupled to the drain of the seventh switch 520 and the drain of the eighth switch 522. The drain of the tenth switch 526 is coupled to the drain of the ninth switch 524 and the output 438a and/or the output 438b. The source of the tenth switch 526 is coupled to the second input 434a and/or the second input 434b and receives the first select signal (line 221) and/or the second select signal (line 223).

When the second inverter 506 receives a logic high value at the gate of the ninth switch 524 and the gate of the tenth switch 526, the tenth switch 526 is enabled and the voltage level at the drain of the ninth switch 524, the drain of the tenth switch 526, and the output 438a and/or the output 438b is a logic low value. When the second inverter 506 receives a logic low value at the gate of the ninth switch 524 and the gate of the tenth switch 526, the ninth switch 524 is enabled and the voltage level at the drain of the ninth switch 524, the drain of the tenth switch 526, and the output 438a and/or the output 438b is the voltage level of the signal at the third input 436a and/or the third input 436b.

Figure 6:
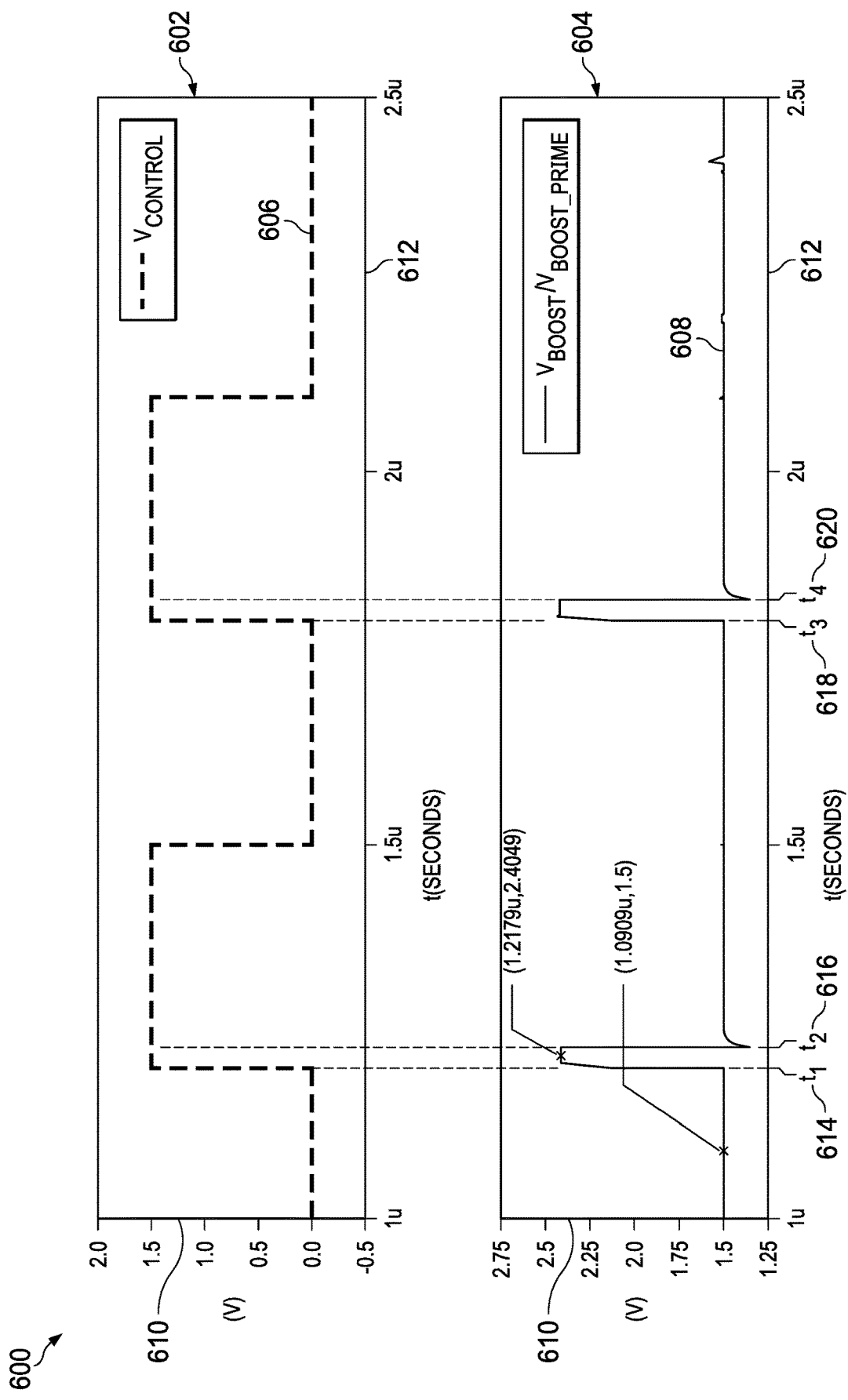
FIG. 6 is a graphical illustration depicting operation of the voltage boost circuit of FIGS. 2 and/or 3.

FIG. 6 is a graphical illustration 600 depicting operation of the voltage boost circuit 236 of FIGS. 2 and/or 3. The graphical illustration 600 includes an example first plot 602 and an example second plot 604. The example first plot 602 includes an example first line 606 and the example second plot 604 includes an example second line 608.

In the example of FIG. 6, the first plot 602 is a plot of the control signal (line 213) versus time. The first plot 602 includes a voltage axis (V) 610 and a time axis (t) 612. The first line 606 corresponds to the voltage value of the signal at the input (e.g., the first input 408) of the voltage boost circuit 236 (e.g., the control signal (line 213).

In the illustrated example of FIG. 6, the second plot 604 is a plot of the boosted control signal (line 215a) and/or the complimented boosted control signal (line 215b) versus time. The second plot 604 includes the voltage axis (V) 610 and the time axis (t) 612. The second line 608 corresponds to the voltage value of the signal at the output (e.g., the output 438a and/or the output 438b) of the voltage boost circuit 236 (e.g., the boosted control signal (line 215a) and/or the complimented boosted control signal (line 215b)).

In the example of FIG. 6, each of the first plot 602 and the second plot 604 includes a first time 614, $t_1$, a second time 616, $t_2$, a third time 618, $t_3$, and a fourth time 620, $t_4$. At the first time 614, the first line 606 transitions from a logic low value (e.g., zero volts) to a logic high value (e.g., 1.5 volts) and the second line 608 is at a voltage level of 1.5 volts. As a result of the rising edge of the first line 606 at the first time 614, the voltage boost network 402 of the voltage boost circuit 236 boosts the voltage value of the output 438a of the first level shifter 404a and/or the output 438b of the second level shifter 404b from 1.5 volts to 2.4049 volts. For example, the rising edge on the first line 606 causes the voltage level at the first terminal 458 of the capacitor 430 (e.g., the output 412) to be boosted while the capacitor 430 discharges.

In the illustrated example of FIG. 6, at the second time 616, the first line 606 is at a logic high value (e.g., 1.5 volts) and the second line 608 transitions from a voltage level of 2.4049 volts to a voltage level of 1.5 volts. For example, the second time 616 can correspond to a time when the capacitor 430 discharges due to the change in voltage caused by the rising edge on the first line 606 at the first time 614.

In the example of FIG. 6, at the third time 618, the first line 606 transitions from a logic low value (e.g., zero volts) to a logic high value (e.g., 1.5 volts) and the second line 608 is at a voltage level of 1.5 volts. As a result of the rising edge of the first line 606 at the third time 618, the voltage boost network 402 of the voltage boost circuit 236 boosts the voltage value of the output 438a of the first level shifter 404a and/or the output 438b of the second level shifter 404b from 1.5 volts to 2.4049 volts. For example, the rising edge on the first line 606 causes the voltage level at the first terminal 458 of the capacitor 430 (e.g., the output 412) to be boosted while the capacitor 430 discharges.

In the illustrated example of FIG. 6, at the fourth time 620, the first line 606 is at a logic high value (e.g., 1.5 volts) and the second line 608 transitions from a voltage level of 2.4049 volts to a voltage level of 1.5 volts. For example, the fourth time 620 can correspond to a time when the capacitor 430 discharges due to the change in voltage caused by the rising edge on the first line 606 at the third time 618.

In the example of FIG. 6, as a result of the boosted voltage level of the second line 608 between the first time 614 and the second time 616 and between the third time 618 and the fourth time 620, the operating area across which read operations of the first memory array (e.g., the second OTP memory array 204) are reliable is improved. Additionally, as a result of the boosted voltage level of the second line 608 between the first time 614 and the second time 616 and between the third time 618 and the fourth time 620, the memory bits, instructions, and/or other information stored in memory arrays (e.g., the first OTP memory array 202, the second OTP memory array 204, etc.) may be read by a processor, CPU, and/or other computing system without the use of an additional volatile memory architecture.

Figure 7:
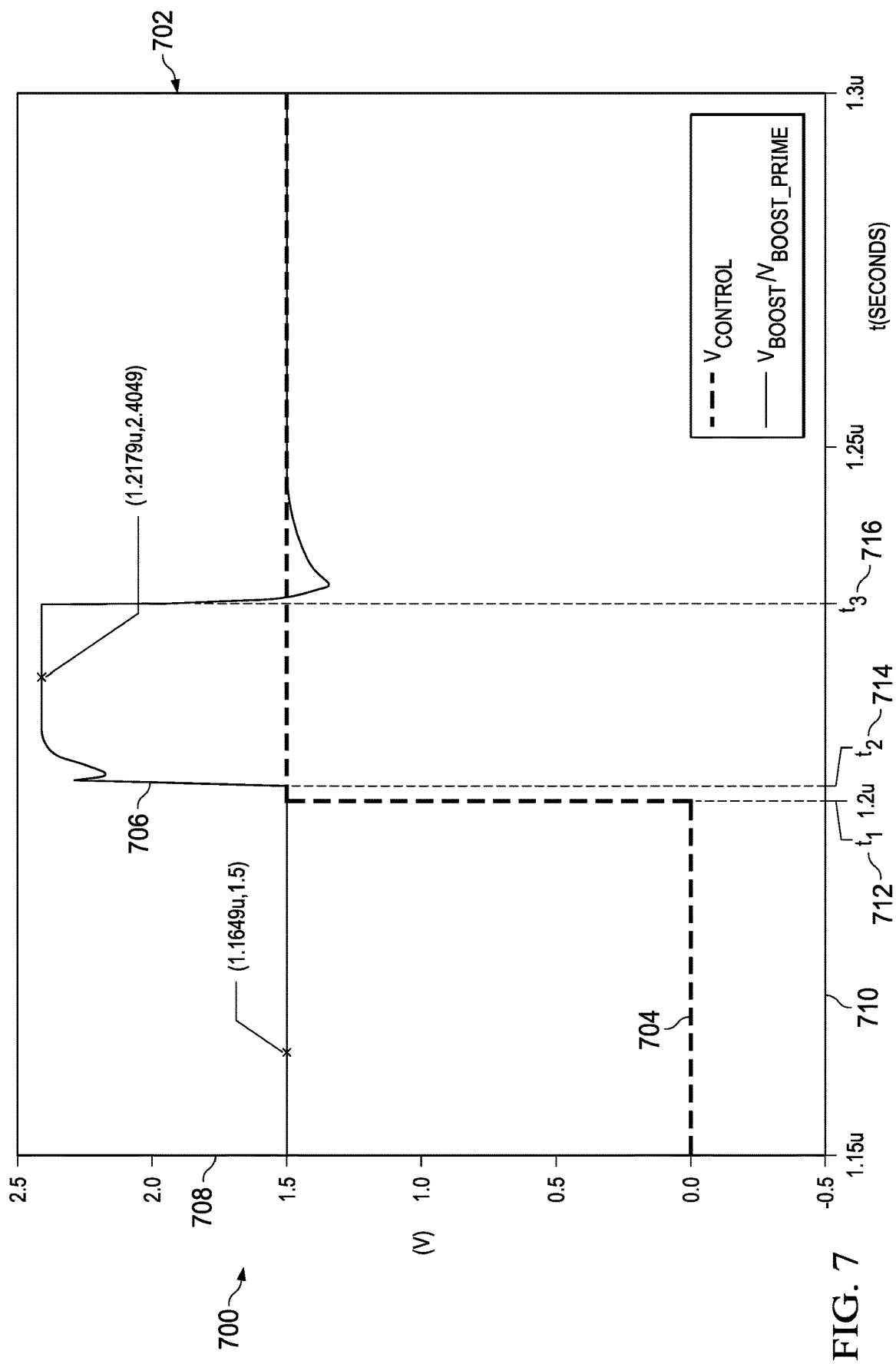
FIG. 7 is a graphical illustration depicting operation of the voltage boost circuit of FIGS. 2 and/or 3 based on a more focused time scale.

FIG. 7 is a graphical illustration 700 depicting operation of the voltage boost circuit 236 of FIGS. 2 and/or 3 based on a more focused time scale. The graphical illustration 700 includes an example plot 702. The example plot 702 includes an example first line 704 and an example second line 706.

In the example of FIG. 7, the plot 702 is a plot of the control signal (line 213) and the boosted control signal (line 215a) and/or the complimented boosted control signal (line 215b) versus time. The plot 702 includes a voltage axis (V) 708 and a time axis (t) 710. The first line 704 corresponds to the voltage value of the signal at the input (e.g., the first input 408) of the voltage boost circuit 236 (e.g., the control signal (line 213)). The second line 706 corresponds to the voltage value of the signal at the output (e.g., the output 438a and/or the output 438b) of the voltage boost circuit 236 (e.g., the boosted control signal (line 215a) and/or the complimented boosted control signal (line 215b)).

In the example of FIG. 7, the plot 702 includes a first time 712, $t_1$, a second time 714, $t_2$, and a third time 716, $t_3$. At the first time 712, the first line 704 transitions from a logic low value (e.g., zero volts) to a logic high value (e.g., 1.5 volts) and the second line 706 is at a voltage level of 1.5 volts. As a result of the rising edge of the first line 704 at the first time 712, the voltage boost network 402 of the voltage boost circuit 236 boosts the voltage value of the output 438a of the first level shifter 404a and/or the output 438b of the second level shifter 404b from 1.5 volts to 2.4049 volts at the second time 714. For example, the rising edge on the first line 704 causes the voltage level at the first terminal 458 of the capacitor 430 (e.g., the output 412) to be boosted while the capacitor 430 discharges.

In the illustrated example of FIG. 7, at the third time 716, the first line 704 is at a logic high value (e.g., 1.5 volts) and the second line 706 transitions from a voltage level of 2.4049 volts to a voltage level of 1.5 volts. For example, the third time 716 can correspond to a time when the capacitor 430 discharges due to the change in voltage caused by the rising edge on the first line 704 at the first time 712.

In the example of FIG. 7, as a result of the boosted voltage level of the second line 706 between the second time 714 and the third time 716, the operating area across which read operations of memory arrays (e.g., the first OTP memory array 202, the second OTP memory array 204, etc.) are reliable is improved. Additionally, as a result of the boosted voltage level of the second line 706 between the second time 714 and the third time 716, the memory bits, instructions, and/or other information stored in memory arrays (e.g., the first OTP memory array 202, the second OTP memory array 204, etc.) may be read by a processor, CPU, and/or other computing system without the use of an additional volatile memory architecture.

While an example manner of implementing the controller 234 and/or the voltage boost circuit 236 of FIG. 2 is illustrated in FIGS. 3, 4, and 5, one or more of the elements, processes and/or devices illustrated in FIGS. 3, 4, and 5 may be combined, divided, re-arranged, omitted, eliminated and/or implemented in any other way. Further, the example signal analyzer 302, the example signal generator 304, the example sensing interface 306, and/or, more generally, the example controller 234 of FIGS. 2 and 3, and/or, the example voltage boost network 402, the example first level shifter 404a, the example second level shifter 404b, the example voltage input 406, the example first inverter 414, the example second inverter 416, the example third inverter 418, the example fourth inverter 420, the example fifth inverter 422, the example first switch 424, the example second switch 426, the example third switch 428, the example capacitor 430, and/or, more generally, the example voltage boost circuit 236 of FIGS. 2 and 4, and/or the example shifting network 502, the example first inverter 504, the example second inverter 506, the example first switch 508, the example second switch 510, the example third switch 512, the example fourth switch 514, the example fifth switch 516, the example sixth switch 518, the example seventh switch 520, the example eighth switch 522, the example ninth switch 524, the example tenth switch 526, and/or, more generally, the example first level shifter 404a and/or the example second level shifter 404b of FIGS. 4 and 5 may be implemented by hardware, software, firmware and/or any combination of hardware, software and/or firmware. Thus, for example, any of the example signal analyzer 302, the example signal generator 304, the example sensing interface 306, and/or, more generally, the example controller 234 of FIGS. 2 and 3, and/or, the example voltage boost network 402, the example first level shifter 404a, the example second level shifter 404b, the example voltage input 406, the example first inverter 414, the example second inverter 416, the example third inverter 418, the example fourth inverter 420, the example fifth inverter 422, the example first switch 424, the example second switch 426, the example third switch 428, the example capacitor 430, and/or, more generally, the example voltage boost circuit 236 of FIGS. 2 and 4, and/or the example shifting network 502, the example first inverter 504, the example second inverter 506, the example first switch 508, the example second switch 510, the example third switch 512, the example fourth switch 514, the example fifth switch 516, the example sixth switch 518, the example seventh switch 520, the example eighth switch 522, the example ninth switch 524, the example tenth switch 526, and/or, more generally, the example first level shifter 404a and/or the example second level shifter 404b of FIGS. 4 and 5 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example signal analyzer 302, the example signal generator 304, the example sensing interface 306, and/or, more generally, the example controller 234 of FIGS. 2 and 3, and/or, the example voltage boost network 402, the example first level shifter 404a, the example second level shifter 404b, the example voltage input 406, the example first inverter 414, the example second inverter 416, the example third inverter 418, the example fourth inverter 420, the example fifth inverter 422, the example first switch 424, the example second switch 426, the example third switch 428, the example capacitor 430, and/or, more generally, the example voltage boost circuit 236 of FIGS. 2 and 4, and/or the example shifting network 502, the example first inverter 504, the example second inverter 506, the example first switch 508, the example second switch 510, the example third switch 512, the example fourth switch 514, the example fifth switch 516, the example sixth switch 518, the example seventh switch 520, the example eighth switch 522, the example ninth switch 524, the example tenth switch 526, and/or, more generally, the example first level shifter 404a and/or the second level shifter 404b of FIGS. 4 and 5 is/are hereby expressly defined to include a non-transitory computer readable storage device or storage disk such as a memory, a digital versatile disk (DVD), a compact disk (CD), a Blu-ray disk, etc. including the software and/or firmware. Further still, the example controller 234 of FIGS. 2 and 3, the example voltage boost circuit 236 of FIGS. 2 and 4, and/or the example first level shifter 404a and/or the example second level shifter 404b of FIGS. 4 and 5 may include one or more elements, processes and/or devices in addition to, or instead of, those illustrated in FIGS. 2, 3, 4, and/or 5 and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 8:
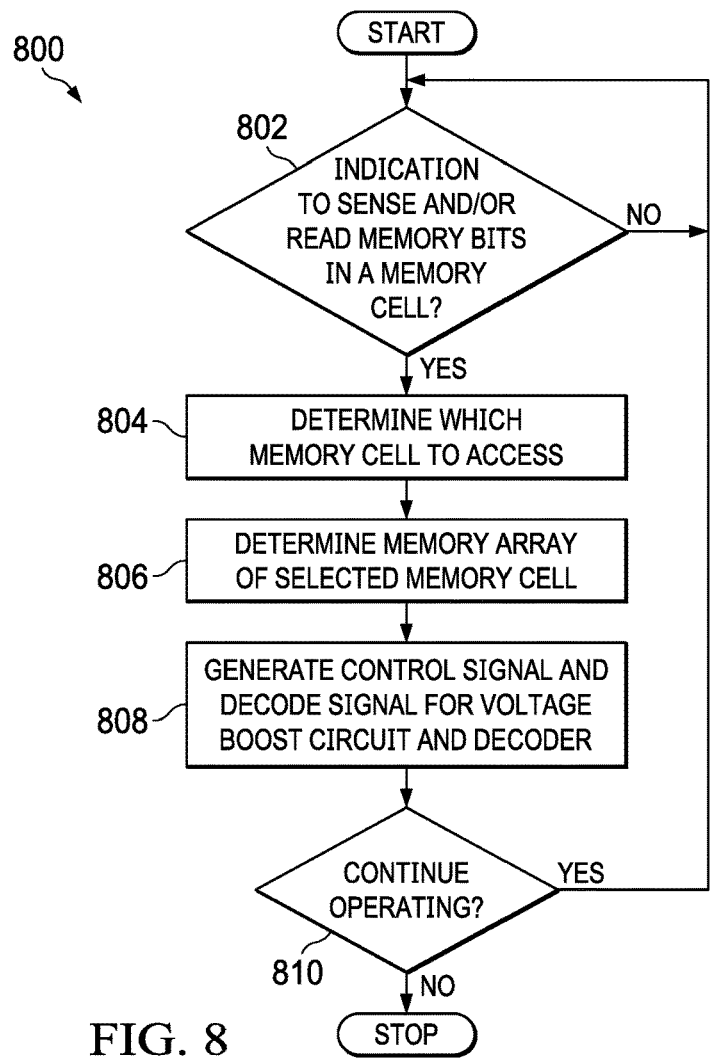
FIG. 8 is a flowchart representative of a process, that may be implemented by example machine readable instructions which may be executed to implement the controller of FIGS. 2 and 3.
Figure 9:
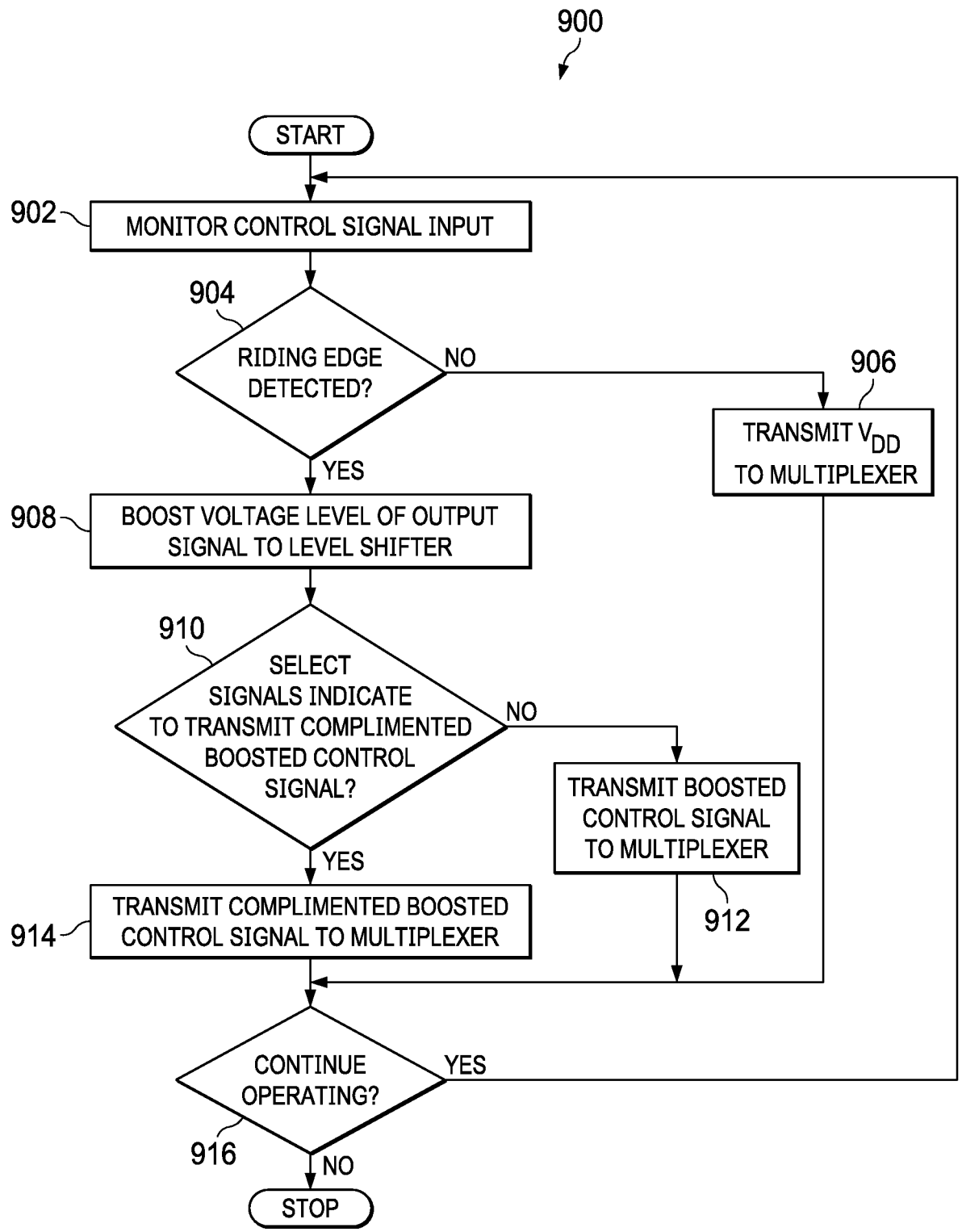
FIG. 9 is a flowchart representative of a process, that may be implemented by example machine readable instructions which may be executed to implement the voltage boost circuit of FIGS. 2, 4, and 5.

Flowchart representative of example hardware logic, machine readable instructions, hardware implemented state machines, and/or any combination thereof for implementing the example controller 234 of FIGS. 2 and 3, the example voltage boost circuit 236 of FIGS. 2 and 4, and/or the example first level shifter 404a and/or the example second level shifter 404b of FIGS. 4 and 5 is shown in FIGS. 8 and 9. The machine readable instructions may be one or more executable programs or portion(s) of an executable program for execution by a computer processor such as the processor 1012 shown in the example processor platform 1000 discussed below in connection with FIG. 10. The program may be embodied in software stored on a non-transitory computer readable storage medium such as a CD-ROM, a floppy disk, a hard drive, a DVD, a Blu-ray disk, or a memory associated with the processor 1012, but the entire program and/or parts thereof could alternatively be executed by a device other than the processor 1012 and/or embodied in firmware or dedicated hardware. Further, although the example program is described with reference to the flowcharts illustrated in FIGS. 8 and 9, many other methods of implementing the example controller 234 of FIGS. 2 and 3, the example voltage boost circuit 236 of FIGS. 2 and 4, and/or the example first level shifter 404a and/or the example second level shifter 404b of FIGS. 4 and 5 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example processes of FIGS. 8 and 9 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 8 is a flowchart representative of a process 800, that may be implemented by example machine readable instructions which may be executed to implement the controller 234 of FIGS. 2 and 3. In the example illustrated in FIG. 8, the signal analyzer 302 of FIG. 3 determines whether an indication to sense and/or read memory bits is obtained and/or otherwise received (block 802). If the control of block 802 returns a NO (e.g., if an indication to sense and/or read memory bits is not obtained or received), then control proceeds to block 802 and waits. Alternatively, if the control of block 802 returns a YES (e.g., if an indication to sense and/or read memory bits is obtained or received by the signal analyzer 302), then the signal analyzer 302 determines, based on the received indication, which memory cells (e.g., the first OTP memory cell 210, the second OTP memory cell 212, the third OTP memory cell 214, and/or the fourth OTP memory cell 216) are to be accessed (block 804). In response to the execution of the control of block 806, control proceeds to block 808.

At block 806, the sensing interface 306 determine the memory array in which the selected one of the memory cells is included. At block 808, the sensing interface 306 generates a control signal (e.g., the control signal (line 213)) and/or a decode signal (e.g., the decode signal (line 231)) to enable conduction of the corresponding PMOS switch and the corresponding NMOS switch of the multiplexer 206 (block 808). In response to the execution of the control of block 808, control proceeds to block 810.

In response, the controller 234 of FIGS. 2 and 3 determines whether to continue operating (block 810). If the control of block 810 returns YES (e.g., the controller 234 determines to continue operating), then control returns to block 802. Alternatively, if the control of block 810 returns NO (e.g., the controller 234 determines not to continue operating), then the process 800 stops.

FIG. 9 is a flowchart representative of a process 900, that may be implemented by example machine readable instructions which may be executed to implement the voltage boost circuit 236 of FIGS. 2, 4, and 5. In FIG. 9, the voltage boost network monitors a signal at the first input 408 (block 902). In response to a rising edge on the signal at the first input 408 (block 904: YES), the voltage boost network 402 boosts the voltage level of a signal to be transmitted to the first level shifter 404a and/or the second level shifter 404b (e.g., boosts the voltage level of the signal at the output 412 of the voltage boost network 402) (block 908). When no rising edge is detected on the signal at the first input 408 (block 904: NO), the voltage boost network 402 transmits to the first level shifter 404a and/or the second level shifter 404b, the signal at the voltage input 406 (e.g., $V_{DD}$) which transmit that signal to the multiplexer 206 (block 906).

After receiving the signal at the output 412 of the voltage boost network 402, the first level shifter 404a and/or the second level shifter 404b determine whether the select signals (lines 221, 223) indicate to transmit the complemented boosted control signal (line 215b) to the multiplexer (block 910). For example, if the first select signal (line 221) is a logic low value and the second select signal (line 223) is a logic high value, the first level shifter 404a can transmit the boosted control signal (line 215a) to the first array NMOS switch 240 and the second level shifter 404b can transmit the reference voltage to the second array NMOS switch 244. For example, if the first select signal (line 221) is a logic high value and the second select signal (line 223) is a logic low value, the first level shifter 404a can transmit the reference voltage to the first array NMOS switch 240 and the second level shifter 404b can transmit the complimented boosted control signal (line 215b) to the second array NMOS switch 244 In response to the select signals (lines 221, 223) indicating to transmit the complimented boosted control signal (block 910: YES), the second level shifter 404b transmits the complimented boosted control signal (line 215a) to the multiplexer 206 (block 914). In response to the select signals (lines 221, 223) indicating to transmit the boosted control signal (block 910: NO), the first level shifter 404a transmits the boosted control signal (line 215a) to the multiplexer 206 (block 912). After transmitting the signal at the output 412 of the voltage boost network 402 to the multiplexer 206 (either complimented boosted at block 914), boosted at block 912, or non-boosted at block 906), the voltage boost circuit 236 determines whether to continue operating (block 916). If the voltage boost circuit 236 determines to continue operating (e.g., the execution of block 916 returns YES), then control proceeds to block 902. Alternatively, in response to the voltage boost circuit 236 determining not to continue operating (e.g., the execution of block 916 returns NO), then the process 900 stops.

Figure 10:
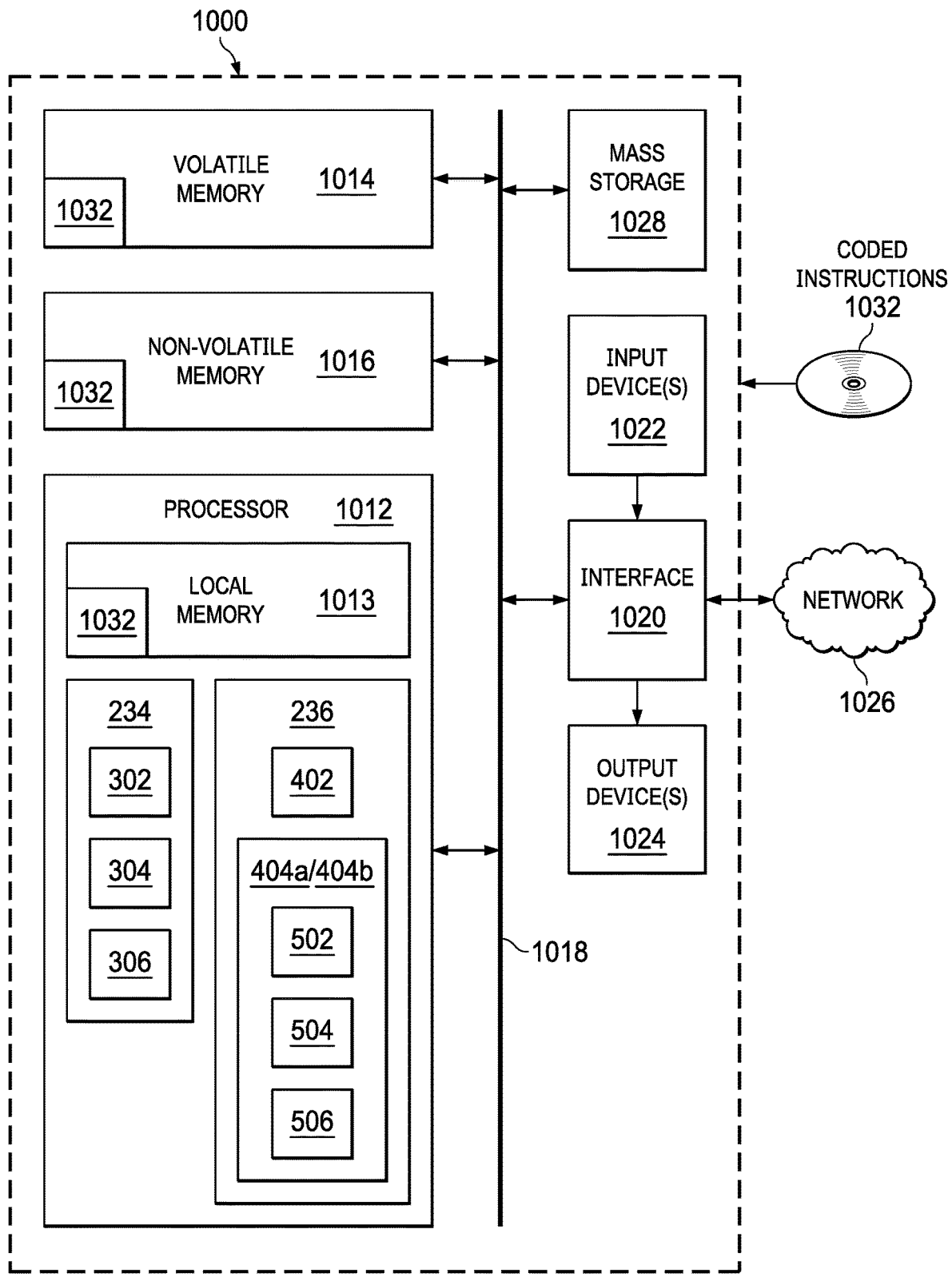
FIG. 10 is a block diagram of an example processing platform structured to execute the instructions of FIGS. 8 and 9 to implement the example controller of FIGS. 2 and 3, the example voltage boost circuit of FIGS. 2 and 4, and/or the example level shifter of FIGS. 4 and 5.

FIG. 10 is a block diagram of an example processing platform structured to execute the instructions of FIGS. 8 and 9 to implement the example controller 234 of FIGS. 2 and 3, the example voltage boost circuit 236 of FIGS. 2 and 4, and/or the example first level shifter 404a and/or the second level shifter 404b of FIGS. 4 and 5. The processor platform 1000 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1000 of the illustrated example includes a processor 1012. The processor 1012 of the illustrated example is hardware. For example, the processor 1012 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example signal analyzer 302, the example signal generator 304, the example sensing interface 306, and/or, more generally, the example controller 234 of FIGS. 2 and 3, and/or, the example voltage boost network 402, the example first level shifter 404a, the example second level shifter 404b, the example voltage input 406, the example first inverter 414, the example second inverter 416, the example third inverter 418, the example fourth inverter 420, the example fifth inverter 422, the example first switch 424, the example second switch 426, the example third switch 428, the example capacitor 430, and/or, more generally, the example voltage boost circuit 236 of FIGS. 2 and 4, and/or the example shifting network 502, the example first inverter 504, the example second inverter 506, the example first switch 508, the example second switch 510, the example third switch 512, the example fourth switch 514, the example fifth switch 516, the example sixth switch 518, the example seventh switch 520, the example eighth switch 522, the example ninth switch 524, the example tenth switch 526, and/or, more generally, the example first level shifter 404a and/or the example second level shifter 404b of FIGS. 4 and 5.

The processor 1012 of the illustrated example includes a local memory 1013 (e.g., a cache). The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1016 may be implemented by flash memory and/or any other desired type of memory device. Access to the main memory 1014, 1016 is controlled by a memory controller.

The processor platform 1000 of the illustrated example also includes an interface circuit 1020. The interface circuit 1020 may be implemented by any type of interface standard, such as an Ethernet interface, a universal serial bus (USB), a Bluetooth® interface, a near field communication (NFC) interface, and/or a PCI express interface.

In the illustrated example, one or more input devices 1022 are connected to the interface circuit 1020. The input device (s) 1022 permit(s) a user to enter data and/or commands into the processor 1012. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1020 of the illustrated example, thus, typically includes a graphics driver card, a graphics driver chip and/or a graphics driver processor.

The interface circuit 1020 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1026. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, redundant array of independent disks (RAID) systems, and digital versatile disk (DVD) drives.

The machine executable instructions 1032 of FIGS. 8 and 9 may be stored in the mass storage device 1028, in the volatile memory 1014, in the non-volatile memory 1016, and/or on a removable non-transitory computer readable storage medium such as a CD or DVD.

From the foregoing, it will be appreciated that example methods, apparatus, and articles of manufacture have been disclosed that reduce the power consumption of a computing device. The example methods, apparatus, and articles of manufacture improve the operating area across which read operations of a memory array are reliable. Additionally, the example methods, apparatus, and articles of manufacture disclosed herein read the memory bits, instructions, and/or other information stored in a memory array without the use of an additional volatile memory architecture. The examples disclosed herein reduce the computational burden of accessing memory. The disclosed methods, apparatus and articles of manufacture improve the efficiency of using a computing device by reducing the power consumption of a computing device and increasing the operating area across which memory can be read. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
a voltage boost circuit including a first output, a second output, a first input configured to be coupled to a controller, a second input coupled to a first output of a decoder, a third input coupled to a second output of the decoder; and
a multiplexer including a first input coupled to the first output of the voltage boost circuit, a second input coupled to the second output of the voltage boost circuit, a third input coupled to an array of memory, and an output coupled to a sensing circuit.

2. The apparatus of claim 1, wherein the voltage boost circuit includes:
a voltage boost network including an output, a first input configured to be coupled to the output of the controller, and a second input coupled to an input voltage node;
a first level shifter including a first input coupled to the second output of the decoder, a second input coupled to the first output of the decoder, a third input coupled to the output of the voltage boost network, and an output coupled to the first input of the multiplexer; and
a second level shifter including a first input coupled to the first output of the decoder, a second input coupled to the second output of the decoder, a third input coupled to the output of the voltage boost network, and an output coupled to the second input of the multiplexer.

3. The apparatus of claim 2, wherein the voltage boost network is configured to:
transmit a signal including a voltage level; and in response to a rising edge on a signal at an output of the controller, boost the voltage level of the signal; and
wherein at least one of the first level shifter or the second level shifter is configured to transmit the signal to the first input of the multiplexer or the second input of the multiplexer based on a first logic value at the first output of the decoder and a second logic value at the second output of the decoder.

4. The apparatus of claim 1, further including an inverter including an output coupled to a fourth input of the multiplexer, and an input coupled to the first output of the decoder.

5. The apparatus of claim 4, wherein:
the array of memory is a first array of memory; and
the multiplexer includes:
a first n-channel transistor including a control terminal coupled to the first output of the voltage boost circuit, a first current terminal coupled to a first current terminal of a first p-channel transistor and the first array of memory, and a second current terminal coupled to a second current terminal of the first p-channel transistor and the sensing circuit; and
a second n-channel transistor including a control terminal coupled to the second output of the voltage boost circuit, a first current terminal coupled to a second array of memory and a first current terminal of a second p-channel transistor, and a second current terminal coupled to a second current terminal of the second p-channel transistor and the sensing circuit.

6. The apparatus of claim 5, wherein the multiplexer includes:
the first p-channel transistor including a control terminal coupled to the first output of the decoder, the first current terminal coupled to the first array of memory and the first current terminal of the first n-channel transistor, and a second current terminal coupled to the sensing circuit and the second current terminal of the first n-channel transistor; and
a second p-channel transistor including a control terminal coupled to the output of the inverter, the first current terminal coupled to the second array of memory and the first current terminal of the second n-channel transistor, and the second current terminal coupled to the sensing circuit and the second current terminal of the second n-channel transistor.

7. The apparatus of claim 1, wherein the array of memory includes a one time programmable memory array.

8. The apparatus of claim 1 in which the voltage boost circuit includes:
a voltage boost network configured to:
transmit a first signal including a voltage level; and
in response to a rising edge on a control signal at an output of a controller, boost the voltage level of the first signal; and a level shifter configured to transmit the first signal to an input of a multiplexer based on a first logic value of a first select signal and a second logic value of a second select signal.

9. The apparatus of claim 8, wherein the voltage boost network includes a first input configured to be coupled to the output of the controller, a second input coupled to an input voltage node, and an output coupled to an input of the level shifter.

10. The apparatus of claim 8, wherein the multiplexer includes a n-channel transistor coupled to an array of memory and wherein the level shifter includes a first input coupled to the first select signal, a second input coupled to the second select signal, a third input coupled to the output of the voltage boost network, and an output coupled to a control terminal of the n-channel transistor.

11. The apparatus of claim 10, wherein the level shifter is configured to, in response to the first logic value of the first select signal being a logic high value and the second logic value of the second select signal being a logic low value, transmit the signal to the control terminal of the n-channel transistor.

12. The apparatus of claim 8, wherein the multiplexer includes a n-channel transistor coupled to an array of memory and wherein the level shifter includes a first input coupled to the second select signal, a second input coupled to the first select signal, a third input coupled to the output of the voltage boost network, and an output coupled to a control terminal of the n-channel transistor.

13. The apparatus of claim 12, wherein the level shifter is configured to, in response to the first logic value of the first select signal being a logic low value and the second logic value of the second select signal being a logic high value, transmit the signal to the control terminal of the n-channel transistor.

14. The apparatus of claim 8, wherein the multiplexer is operable to select a one time programmable memory array.

15. A method process of operating a memory circuit comprising:
providing a gate signal to a first transistor of a multiplexer at a first voltage;
receiving from a controller a control signal having an edge changing from one logic level to another logic level;
in response to the edge change, boosting the gate signal from the first voltage to a second voltage for a certain period; and
passing a bit current from a memory cell through the first transistor to a sensing circuit during the certain period.

16. The process of claim 15, in which the multiplexer includes a first n-channel transistor coupled to a first array of memory and a second n-channel transistor coupled to a second array of memory and the first transistor is the first n-channel transistor.

17. The process of claim 16, in which the first array of memory and the second array of memory include a one time programmable memory array.

18. The process of claim 15, further including transmitting a memory bit from the sensing circuit to a computing system.

* * * * *